US006492711B1

(12) United States Patent
Takagi et al.

(10) Patent No.: US 6,492,711 B1
(45) Date of Patent: Dec. 10, 2002

(54) HETEROJUNCTION BIPOLAR TRANSISTOR AND METHOD FOR FABRICATING THE SAME

(75) Inventors: Takeshi Takagi, Kyoto (JP); Koichiro Yuki, Osaka (JP); Kenji Toyoda, Osaka (JP); Yoshihiko Kanzawa, Osaka (JP)

(73) Assignee: Matsushita Electric Industrial Co., Ltd. (JP)

( * ) Notice: Subject to any disclaimer, the term of this patent is extended or adjusted under 35 U.S.C. 154(b) by 39 days.

(21) Appl. No.: 09/598,639

(22) Filed: Jun. 21, 2000

(30) Foreign Application Priority Data

Jun. 22, 1999 (JP) ............................................ 11-175046

(51) Int. Cl.[7] ............................................ H01L 27/082
(52) U.S. Cl. ..................... 257/593; 257/197; 257/616
(58) Field of Search ................. 257/197, 593, 257/616

(56) References Cited

U.S. PATENT DOCUMENTS 4,885,614 A    12/1989  Furukawa et al.
6,087,683 A  *  7/2000  King et al. ................ 257/183

FOREIGN PATENT DOCUMENTS

JP    05-102177    4/1993
WO    98/26457     6/1998

OTHER PUBLICATIONS

European Search Report, Dec. 4, 2000, ., 5 pages.
Patent Abstracts of Japan, JP 05–102177, Apr. 23, 1993, , Mori Kazutaka.

L.D. Lanzerotti et al., "Si/Si$_{1-x-y}$Ge$_x$C$_y$/Si Heterojunction Bipolar Transistors", IEEE Electron Device Letters, vol. 17, No. 7, pp. 334–337, Jul. 1996.

Carroll et al., "Quantitative Measurement of Reduction of Boron Diffusion by Substitutional Carbon Incorporation", pp. 417–422, 1998, Mat. Res. Soc. Symp. Proc. vol. 527. XP–000941032.

Jayanarayanan et al., "Potential for Silicon–Germanium–Carbon HBT Operation at Cryogenic Temperatures", pp. 240–245, Electrochemical Society Proceeding vol. 97–2.

Patton et al., "Graded–SiGe–Base, Poly–Emitter Heterojunction Bipolar Transistors", pp. 534–536, Dec. 1989, IEEE Electron Device Letters, vol. 10, No. 12.

European Search Report, Mailing Date: Jun. 21, 2001.

* cited by examiner

Primary Examiner—Douglas A. Wille
(74) Attorney, Agent, or Firm—Nixon Peabody LLP; Donald R. Studebaker

(57) ABSTRACT

A heterojunction bipolar transistor is fabricated by stacking a Si collector layer, a SiGeC base layer and a Si emitter layer in this order. By making the amount of a lattice strain in the SiGeC base layer on the Si collector layer 1.0% or less, the band gap can be narrower than the band gap of the conventional practical SiGe (the Ge content is about 10%), and good crystalline can be maintained after a heat treatment. As a result, a narrow band gap base with no practical inconvenience can be realized.

22 Claims, 21 Drawing Sheets

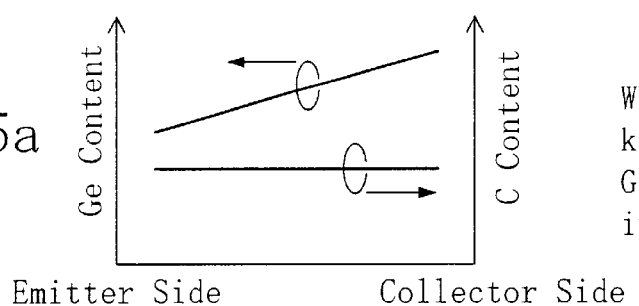
Fig. 15a — When C content is kept constant and Ge content is increased
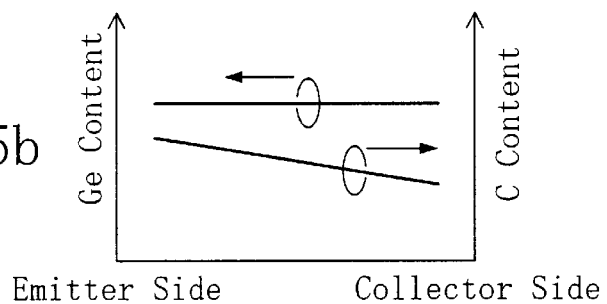
Fig. 15b — When Ge content is kept constant and C content is decreased
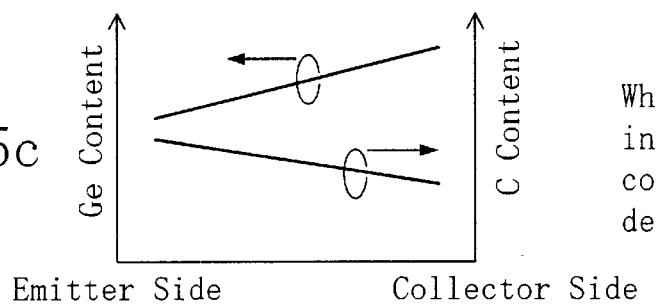
Fig. 15c — When Ge content is increased and C content is decreased
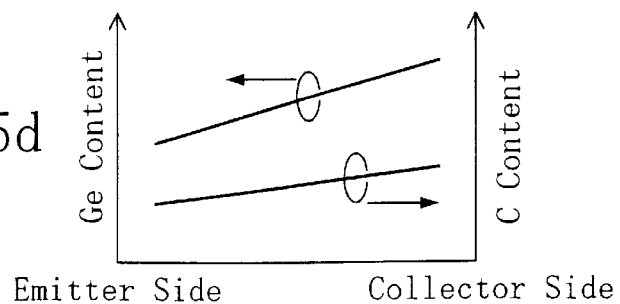
Fig. 15d — When both Ge content and C content are increased

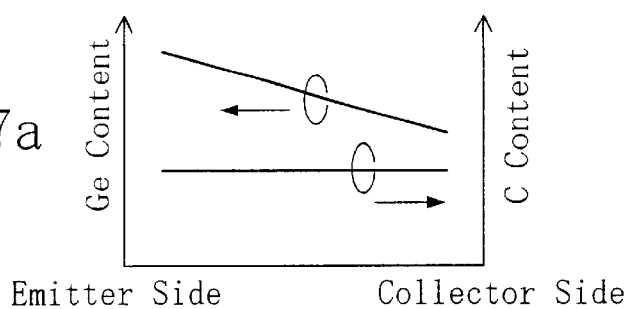
Fig. 17a — When C content is kept constant and Ge content is decreased
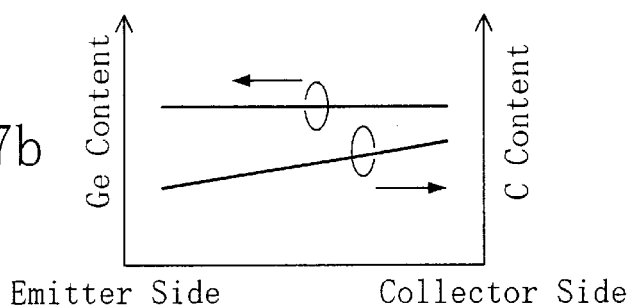
Fig. 17b — When Ge content is kept constant and C content is increased
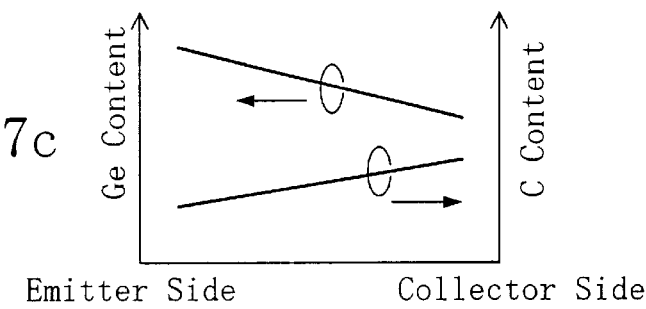
Fig. 17c — When Ge content is decreased and C content is increased
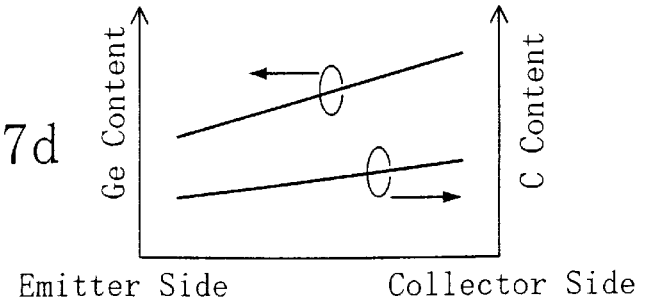
Fig. 17d — When both Ge content and C content are increased

HETEROJUNCTION BIPOLAR TRANSISTOR AND METHOD FOR FABRICATING THE SAME

BACKGROUND OF THE INVENTION

The present invention relates to a heterojunction bipolar transistor which includes a base layer containing a SiGeC layer with a small degree of lattice strain.

Conventionally, heterojunction bipolar transistors (HBT's) have a heterojunction barrier formed on the boundary between the energy bands of the two semiconductor materials differing in band gap from each other at a junction between the emitter, the base and the collector for the purpose of improving carrier accumulation and a current amplification ratio. Such HBT's have come to be used as an active device in a microwave and millimeter wave bands by making use of their high frequency characteristic. Above all, HBT's using a semiconductor of a Group III–V compound such as GaAs have been studied and developed most energetically; however, in recent years, HBT's using SiGe material, which is a Group IV—IV compound and can be formed on a silicon substrate are being drawn attention (SiGe-HBT's). These SiGe-HBT's are being drawn attention also because the base layer made of a SiGe layer with a narrow band gap makes them operable at a lower voltage than Si-BJT's.

SiGe-HBT's proposed so far to achieve speedups are classified into two typical types: the one with a SiGe base layer having a graded composition where the Ge content is gradually increased in the direction from the emitter layer side to the collector layer side (Reference Document 1) (L. Harame et al., "Optimization of SiGe HBT Technology for High Speed Analog and Mixed-Signal Applications," IEDM Tech. Dig. 1993, p.71), and the other with a base layer having a high Ge content and a high concentration of impurity doping so as to make the base layer extremely thin (Reference Document 2) (A. Schuppen et al., "Enhanced SiGe Heterojunction Bipolar Transistors with 160 GHz-fmax," IEDM Tech. Dig. 1995, p. 743.).

In the former transistors provided with the base layer having a graded composition, the graded composition develops an electric field, which facilitates carriers injected in the base layer to drift the base layer. The drifting of the carriers due to the drift electric field is higher in speed than carrier diffusion, so that the time required to transit the base layer (base transit time) is accelerated to provide a high frequency transistor.

On the other hand, the latter heterojunction bipolar transistors have a base layer composed of SiGe having a uniform composition with a high Ge content and having a narrow band gap. The base layer is doped with a high-concentration impurity for carriers in order to decrease its thickness while suppressing a punch through between the emitter and the collector, thereby to accelerate the base transit time. In this case, the base layer having a narrower band gap than the emitter layer reduces the built-in potential of the PN junction between the emitter and the base, thereby achieving a large collector current and a high frequency characteristic at a low voltage.

However, these prior art heterojunction bipolar transistors have the following inconveniences.

First, in the heterojunction bipolar transistors having the graded composition base structure, the gradient of the composition must be large enough to have a large drift electric field. In otherwords, of the base layer, the region in contact with the emitter layer must have a small Ge content, and the region in contact with the collector layer must have a large Ge content. For this, the region of the base layer that is in contact with the emitter layer is generally made from Si only, without Ge. Since the PN junction between the base and the emitter in this case is a homogeneous junction between silicon and silicon, low-voltage operation cannot be expected. In addition, further acceleration of the base transit time for the improvement of the high frequency characteristic requires to further increase the Ge content in the region of the base layer that is in contact with the collector layer; however, when the Ge content is too large, the difference in lattice constant between Si and Ge (lattice mismatch) in the SiGe layer formed on the Si substrate causes dislocations in the base layer, deteriorating the reliability. This indicates that there are limits on an increase in the Ge content. According to Reference Document 3 (S. R. Stiffler et. al., "The thermal stability of SiGe films deposited by ultrahigh-vacuum chemical vapor deposition," J. Appl. Phys., 70 (3), pp. 1416–1420, 1991.), the upper limit for a practical Ge content in the base layer of a heterojunction bipolar transistor is around 10%. Therefore, under the present circumstances, it is difficult to increase the gradient of the composition of the base layer in order to provide a transistor with a higher frequency or a lower voltage.

On the other hand, the heterojunction bipolar transistors with the uniform composition base structure also have the issue of the critical thickness of the base layer, which causes dislocations due to the above-described lattice constant difference. In reality, the SiGe-HBT having a high Ge content shown in Reference Document 2 suppresses the occurrence of dislocations by not using a process requiring a high temperature treatment during fabricating. Therefore, a silicon process requiring a high temperature treatment cannot be applied, making it impossible to realize a mixed device like a BiCMOS device or an integrated circuit. As a result, there are limits on achieving lower-voltage operation by further reducing the built-in potential.

SUMMARY OF THE INVENTION

The object of the present invention is to provide a heterojunction bipolar transistor which can operate at a low voltage and a high speed while maintaining high reliability by providing a means for reducing the amount of lattice strain in the base layer even when there is a large difference between the average band gap of the collector layer and the emitter layer, and the band gap of the base layer.

The heterojunction bipolar transistor of the present invention comprises a first semiconductor layer made from semiconductor material containing Si as a component; a second semiconductor layer made from semiconductor material containing Si, Ge and C as components, having a band gap narrower than the first semiconductor layer and consisting of a top layer, a center layer and a bottom layer; a third semiconductor layer made from Si as a component, and having a band gap wider than the second semiconductor layer stuched in this order onto a substrate; and a heterojunction barrier provided between the first semiconductor layer and the second semiconductor layer, and further comprises: a collector layer formed in the first semiconductor layer and containing a first conductive impurity; a base layer formed in the second semiconductor layer and containing a second conductive impurity; and an emitter layer formed in the third semiconductor layer and containing a first conductive impurity, the second semiconductor layer having an average lattice strain of 1.0% or less.

By controlling the Ge and C contents in the second semiconductor layer represented by, for example, $Si_{1-x-y}Ge_xC_y$ where x is the Ge content and y is the C content, it becomes possible to realize low-voltage operation due to a reduction in the built-in potential of the PN junction between the emitter and the base, and to improve operation speed due to the graded composition base structure. In that case, unlike the SiGe layer epitaxially grown on the Si layer, there is no strict upper limit for the Ge content to prevent lattice defect resulting from lattice mismatch. In other words, in the second semiconductor layer including Si, Ge and C as its components, the difference in band gap between the second semiconductor layer and the first and third semiconductor layers can be enlarged, while the average lattice strain, which results from the lattice mismatch with the first and third semiconductor layers that are made from Si and other materials, is restricted to 1.0% or less. As a result, highly reliable and functional heterojunction bipolar transistor can be obtained.

In the heterojunction bipolar transistor, when the second semiconductor layer has undergone a compressive strain, the difference in band gap between the second semiconductor layer made from SiGeC and the first semiconductor layer can be sufficiently large while the C content is reduced. This secures reliability and improves functions as well.

In the heterojunction bipolar transistor, when the band gap of the second semiconductor layer is 1.04 eV or less, it is sufficiently different from the band gap of Si, that is, 1.12 eV or less, thereby providing the same advantages as above.

In the heterojunction bipolar transistor, the first semiconductor layer is made of Si single crystal; and when the second semiconductor layer has a composition represented by $Si_{1-x-y}Ge_xC_y$ where x is the Ge content and y is the C content, the composition is in a region surrounded by the following four straight lines:

straight line ①: y=0.122x−0.032 straight line ②: y=0.124x+0.028 straight line ③: y=0.2332x−0.0233 (C content is 22% or less)

straight line ④: y=0.0622x+0.0127 (Ge content is 22% or less)

on two-dimensional rectangular coordinates whose horizontal axis and vertical axis indicate the Ge content and the C content, respectively. As a result, the lattice strain is restricted to 1.0% or less.

In the heterojunction bipolar transistor, when the center layer of the second semiconductor layer has a uniform composition, a large difference in band gap is secured between the second semiconductor layer and the first and third semiconductor layers.

In the heterojunction bipolar transistor whose center layer has a uniform composition, when the C content in the top layer of the second semiconductor layer increases in the direction from the third semiconductor layer to the center layer, the band structure changes smoothly with almost no band offsets like notches in the emitter-base junction, which provides the heterojunction bipolar transistor with excellent high frequency characteristic.

In the heterojunction bipolar transistor whose center layer has a uniform composition, when the C and Ge contents in the top layer of the second semiconductor layer, which is arranged between the center layer and the third semiconductor layer, increase in the direction from the third semiconductor layer to the center layer, a band structure which changes further smoothly at the emitter-base junction can be obtained.

In the heterojunction bipolar transistor whose center layer has a uniform composition, when the C content in the bottom layer of the second semiconductor layer decreases in the direction from the center layer to the first semiconductor layer, the band structure changes further smoothly with almost no band offsets like notches in the emitter-base junction.

In the heterojunction bipolar transistor whose center layer has a uniform composition, when the C and Ge contents in the bottom layer of the second semiconductor layer decrease in the direction from the center layer to the first semiconductor layer, the band structure changes further smoothly at the emitter-base junction.

In the fundamental structure of the heterojunction bipolar transistor, the band gap in the center layer of the second semiconductor layer decreases in the direction from the third semiconductor layer to the first semiconductor layer, the transit of the carriers in the base layer is stimulated by an electric field, which accelerates the base transit time, thereby providing the high-speed heterojunction bipolar transistor.

In order to decrease the band gap of the second semiconductor layer in the direction from the third semiconductor layer to the first semiconductor layer, the following structures are available.

The third semiconductor layer may be exclusively made from Si; the top layer of the second semiconductor layer may have a composition which changes contiguously to the center layer, and the portion of the top layer that is in contact with the third semiconductor layer may be exclusively made from Si; and the center and top layers of the second semiconductor layer may have a graded composition where at least one of the Ge content and the C content increases in the direction from the third semiconductor layer to the first semiconductor layer.

In that case, in the center and top layers of the second semiconductor layer, the Ge and C contents increase while the ratio between these contents is kept constant.

In the heterojunction bipolar transistor whose second semiconductor layer has a graded composition, when the C content or the C and Ge contents in the bottom layer of the second semiconductor layer decrease in the direction from the center layer to the first semiconductor layer, the band structure changes smoothly with almost no band offsets like notches in the emitter-base junction as mentioned above.

In the heterojunction bipolar transistor whose second semiconductor layer has a graded composition, when the top layer of the second semiconductor layer is made from Si and contains at least one of Ge and C, either the Ge content or the-C content may be changed in the direction from the third semiconductor layer to the first semiconductor layer.

Structures having such a graded composition-are as follows.

When the center layer of the second semiconductor layer has a composition which undergoes a compressive strain, there is a graded composition where the Ge content increases in the direction from the third semiconductor layer to the first semiconductor layer, while the C content is kept constant; there is another graded composition where the C content decreases in the direction from the third semiconductor layer to the first semiconductor layer, while the Ge content is kept constant; there is further another graded composition where the Ge content increases and the C content decreases in the direction from the third semiconductor layer to the first semiconductor layer; and there is further another graded composition where the Ge content and the C content increase in the direction from the third semiconductor layer to the first semiconductor layer.

When the center layer of the second semiconductor layer has a composition which undergoes a tensile strain, there is a graded composition where the Ge content decreases in the direction from the third semiconductor layer to the first semiconductor layer, while the C content is kept constant; there is another graded composition where the C content increases in the direction from the third semiconductor layer to the first semiconductor layer, while the Ge content is kept constant; there is further another graded composition where the Ge content decreases and the C content increases in the direction from the third semiconductor layer to the first semiconductor layer; and there is further another graded composition where the Ge content and the C content increase in the direction from the third semiconductor layer to the first semiconductor layer.

By providing the center layer of the second semiconductor layer with a graded composition within the region having either a compressive strain or a tensile strain, the SiGeC content changes without passing through the region where the center layer made from SiGeC is lattice-matched. This can avoids inconveniences like a reverse gradient of the band gap in the center layer of the second semiconductor layer.

In the heterojunction bipolar transistor where the center layer of the second semiconductor layer has a graded composition, it is preferable that either the C content or the C and Ge contents in the top layer of the second semiconductor layer increases in the direction from the third semiconductor layer to the center layer.

It is also preferable that either the C content or the C and Ge contents in the bottom layer of the second semiconductor layer decrease in the direction from the center layer to the first semiconductor layer.

The method for fabricating a heterojunction bipolar transistor of the present invention comprising: process (a) for forming, on a first semiconductor layer of first conductivity type which contains Si as a component and functions as a collector layer, a second semiconductor layer containing a SiGeC layer and having a narrower band gap than the first semiconductor layer and an average lattice strain of 1.0% or less; process (b) for forming a third semiconductor layer containing at least Si and having a band gap wider than the second semiconductor layer onto the second semiconductor layer; process (c) for forming a conductive layer containing a first conductivity type impurity which is in contact with a part of the third semiconductor layer; process (d) for forming a base layer by introducing a second conductivity type impurity at least to a part of the second semiconductor layer; and process (e) for forming an emitter diffusion layer by diffusing the first conductivity type impurity in said conductive layer into the third semiconductor layer by a heat treatment.

According to this method, it has been confirmed that in fabricating the heterojunction bipolar transistor, when the crystalline of the second semiconductor layer including Si, Ge and C has an average lattice strain of 1.0% or less, the excellent crystalline is maintained after the heat treatment conducted in the process (e). Thus, the diffusion of the first conductivity type impurity from the conductive layer makes it possible to provide the emitter diffusion layer only at the local portion of the third semiconductor layer, thereby achieving a heterojunction bipolar transistor with excellent electric properties including a high frequency characteristic.

It is preferable that a Si layer is used for the first semiconductor layer, and in said process (a), a $Si_{1-x-y}Ge_xC_y$ layer (where x is the Ge content and y is the C content) is formed as the second semiconductor layer, and in said process (b), a Si layer is formed as the third semiconductor layer.

It is also preferable that in the process (a), the second semiconductor layer is formed to have a composition in the range surrounded by four straight lines as follows on two-dimensional rectangular coordinates whose horizontal axis and vertical axis indicate the Ge content and the C content, respectively;

straight line ①: y=0.122x−0.032
straight line ②: y=0.1245x+0.028
straight line ③: y=0.2332x−0.0233 (Ge content is 22% or less)
straight line ④: y=0.0622x+0.0127 (Ge content is 22% or less).

In the process (b), the first conductivity type impurity is doped in the third semiconductor layer concurrently with epitaxial growth in order to increase the concentration of the impurity in the third semiconductor layer in addition to the introduction of the impurity in the process (e), while avoiding the influence of the concentration of the impurity on the other region.

BRIEF DESCRIPTION OF THE DRAWINGS

FIGS. 15(a) to 15(d) are diagrams showing the composition gradating methods respectively corresponding to the straight lines Co1 to Co4 shown in FIG. 14.

FIGS. 17(a) to 17(d) are diagrams showing the composition gradating methods respectively corresponding to the straight lines Te1 to Te4 shown in FIG. 16.

FIG. 18 is a plot showing the relation between the Ge content, lattice strain and critical thickness of the SiGe film formed on the Si layer in the prior art SiGe-HBT or the like.

DETAILED DESCRIPTION OF THE INVENTION

Advantages of Making the Base Layer of a SiGeC Layer

Before describing each embodiment of the present invention, advantages of using a SiGeC layer which is a ternary mixed crystal semiconductor containing Si, Ge and C for the base layer in a heterojunction bipolar transistor will be described as follows.

Figure 18:
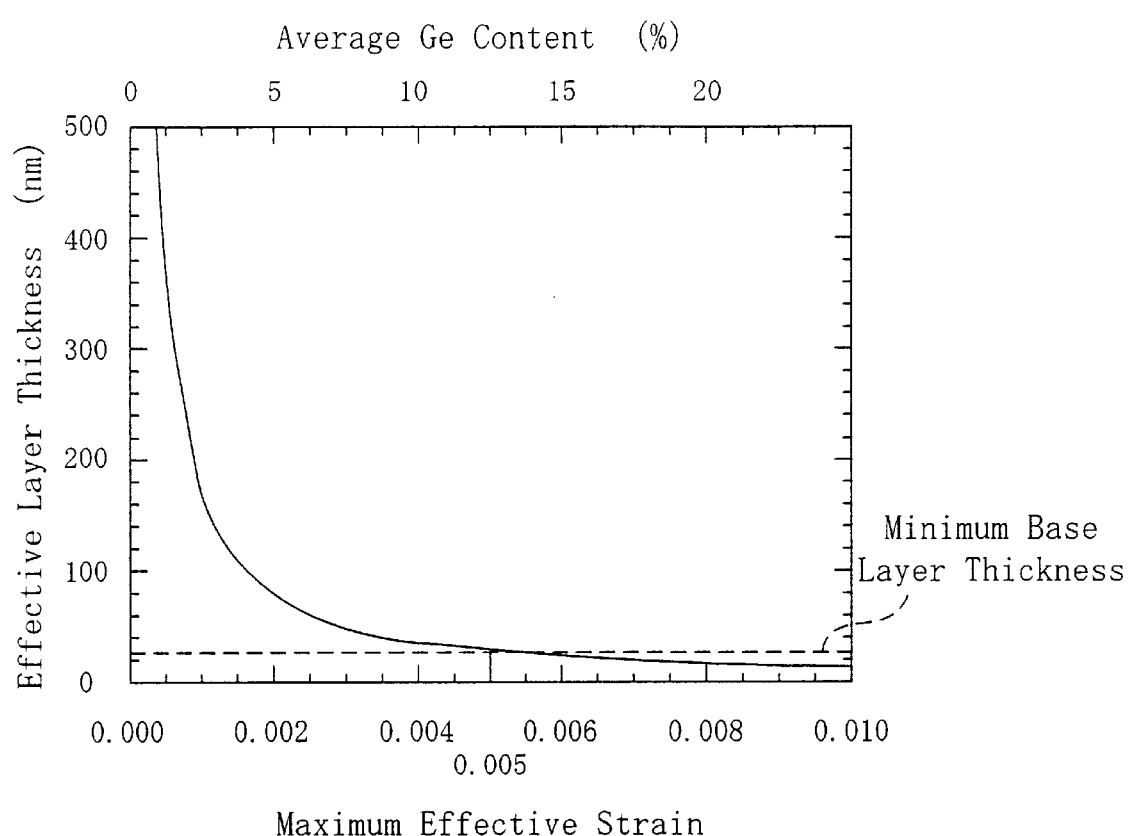

FIG. 18 is a plot showing the relation between the Ge content, lattice strain and critical thickness of the SiGe film formed on the Si layer in the prior art SiGe-HBT or the like. Judging from the fact that the minimum thickness of the base layer practical for a HBT is around 25 nm, it will be necessary for the SiGe film to have a composition with a lattice strain of less than 0.5%.

On the other hand, some information of the band gap of the SiGeC ternary mixed crystal semiconductor is described in Reference Document 4 (K. Brunner et. al., "SiGeC: Band gaps, band offsets, optical properties, and potential applications," J. Vac. Sic. Technol. B 13 (3), pp. 1701–1706, 1998). This information reveals that the SiGeC ternary mixed crystal semiconductor has a narrower band gap than Si single crystal, and that a semiconductor layer having a small lattice strain can be formed by providing a SiGeC layer on the Si single crystal.

Figure 19:
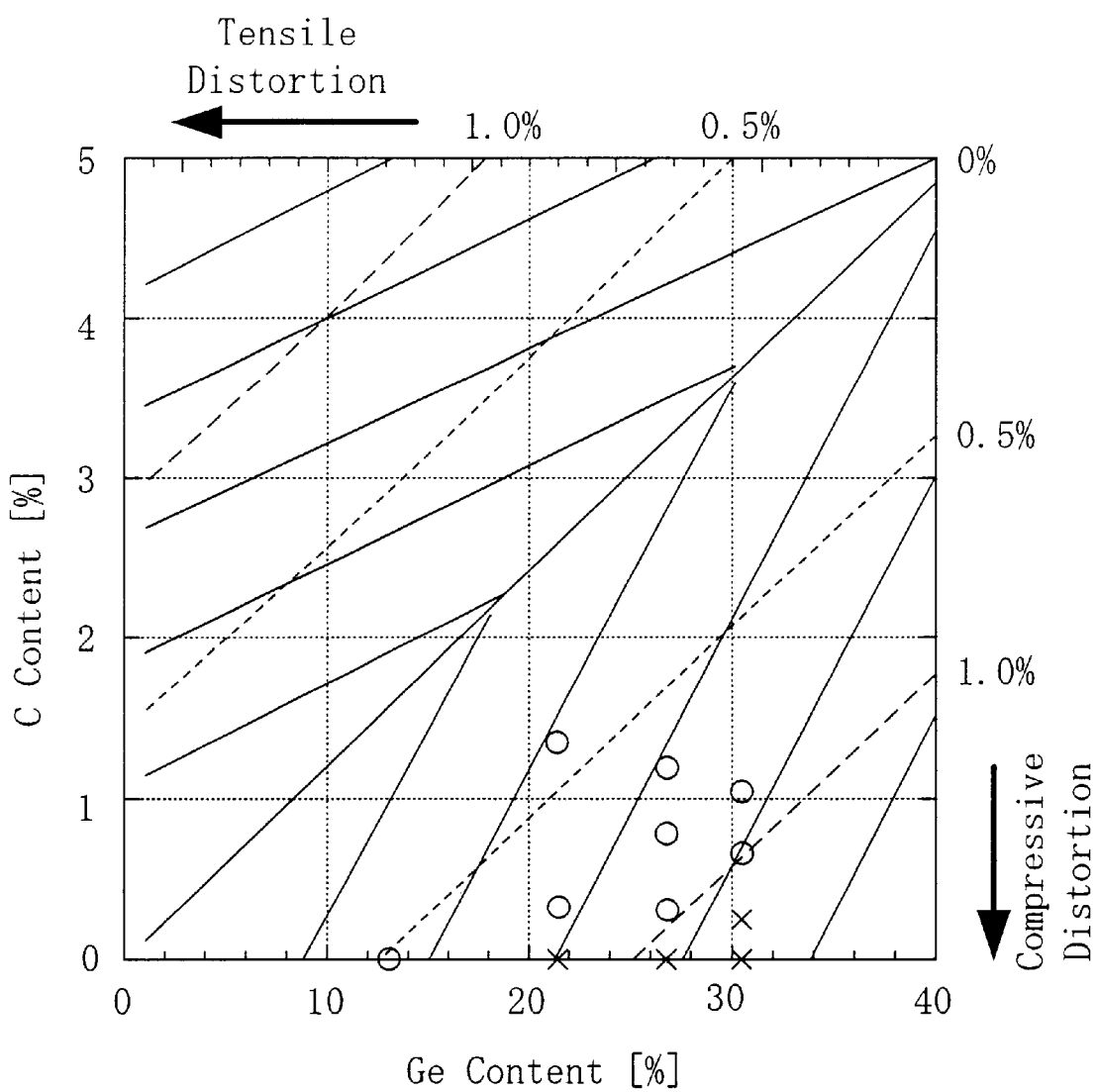
FIG. 19 is a data showing changes in crystallinity when a heat treatment (Rapid Thermal Annealing: RTA) for 15 seconds at 950° C. is applied to the SiGeC crystal layer represented by a general formula: $Si_{1-x-y}Ge_xC_y$.

FIG. 19 is a data obtained from experiments conducted by the inventors of the present invention, showing changes in crystallinity when a heat treatment (RTA) is applied for 15 seconds at 950° C. to the SiGeC crystal layer represented by a general formula: $Si_{1-x-y}Ge_xC_y$. In this diagram, the horizontal and vertical axes indicate the Ge content and the C content, respectively, and straight lines indicate composition requirements for keeping the amount of strain (including compressive and tensile strains) and band gap constant. Each symbol ○ indicates the values of the Ge and C contents when the crystalline is well maintained, and each symbol X indicates the values of the Ge and C contents when the crystalline is deteriorated. The diagram reveals that in the $Si_{1-x-y}Ge_xC_y$ crystal layer, the crystalline is well maintained without being deteriorated as long as the strain is below 1.0% even if it is over 0.5%. Although the data of FIG. 19 only shows the case of compressive strain, the same amount of strain is considered to be a critical value for the tensile strain on principle.

Figure 20A:
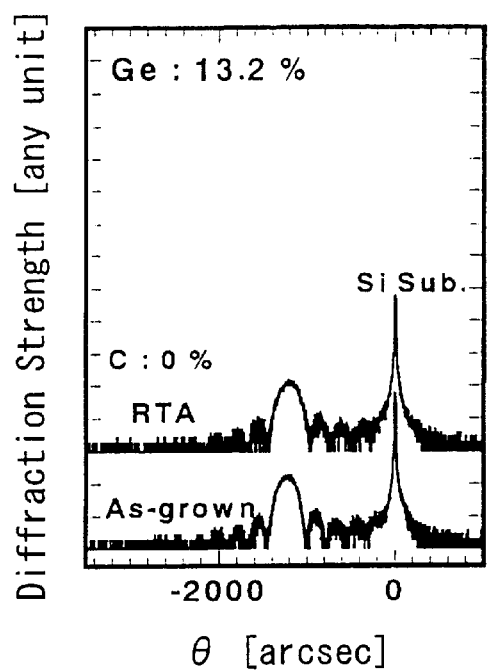
FIGS. 20(a) to 20(d) are diagrams showing changes in X-ray diffraction spectra as a result of the heat treatment in each composition of the $Si_{1-x}Ge_x$ crystal layer and the $Si_{1-x-y}Ge_xC_y$ crystal layer.
Figure 20B:
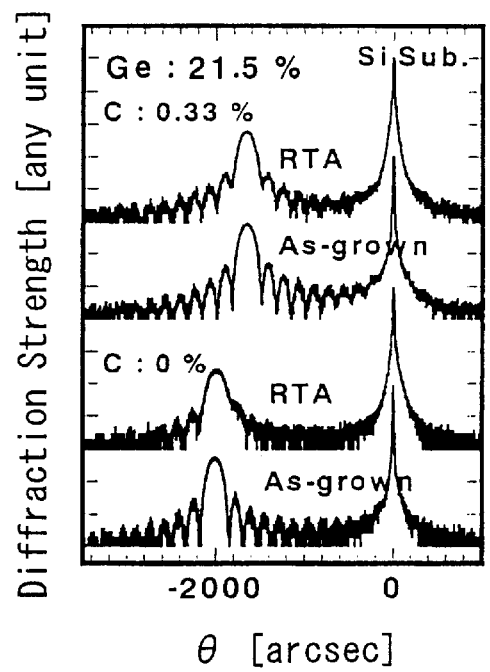
Figure 20C:
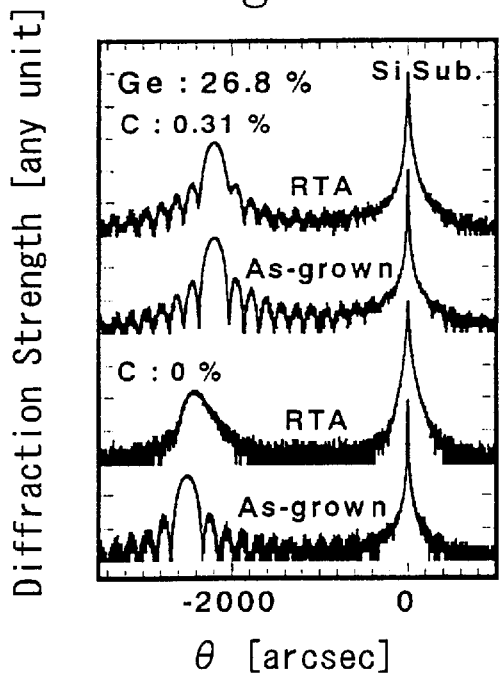

FIGS. 20(a) to 20(d) are diagrams showing changes in X-ray diffraction spectra as a result of the heat treatment in each composition of the $Si_{1-x}Ge_x$ crystal layer and the $Si_{1-x-y}Ge_xC_y$ crystal layer. Of these diagrams, FIGS. 20(a) and 20(d) only show changes in the X-ray diffraction spectra of the $Si_{1-x}Ge_x$ crystal layer when the layer has a Ge content of 13.2% and 30.5%, respectively, and FIG. 20(b) and 20(c) show changes in X-ray diffraction spectra as a result of the heat treatment in the $Si_{1-x-y}Ge_xC_y$ crystal layer and the $Si_{1-x}Ge_x$ crystal layer when these layers have a Ge content of 21.5% and 26.8%. The compositions of the $Si_{1-x-y}Ge_xC_y$ crystal layer shown in FIGS. 20(b) and 20(c) are included in a measured point shown in FIG. 19.

Figure 20D:
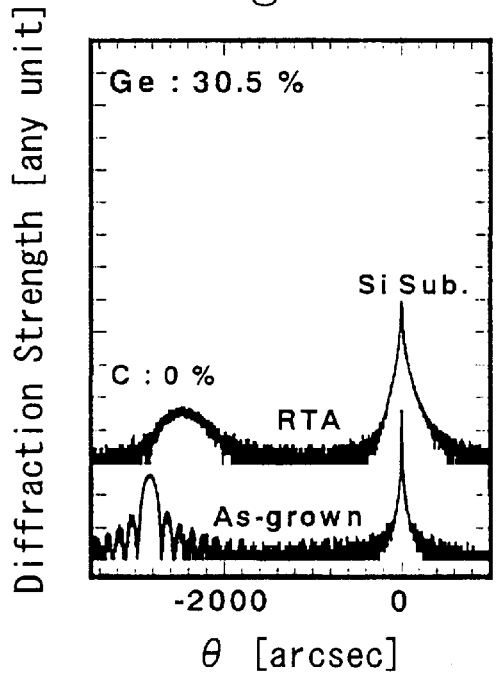

For example, in FIG. 20(a), on and after the second diffraction peaks on both sides of the zero diffraction peak do not change so much (not broken) after the heat treatment, so that the crystalline of the $Si_{1-x}Ge_x$ crystal layer is considered to be maintained comparatively well. This composition corresponds to that of the $Si_{1-x}Ge_x$ crystal layer having a strain of 0.5% or so shown in FIG. 18. As shown in FIG. 20(d), when the Ge content is 30.5%, on and after the second diffraction peak patterns on both sides of the zero diffraction peak are hardly recognized after the heat treatment, so that the crystalline of the $Si_{1-x}Ge_x$ crystal layer is considered to is deteriorated. This composition corresponds to that of the $Si_{1-x}Ge_x$ crystal layer having a strain of 1.0% or above shown in FIG. 18.

On the other hand, in FIG. 20(b), on and after the second diffraction peaks on both sides of the zero diffraction peak do not change so much (not broken) after the heat treatment, so that the crystalline of the $Si_{1-x-y}Ge_xC_y$ crystal layer having a C content of 0.33% is considered to be maintained comparatively well. In contrast, when the C content is 0, or in the case of the $Si_{1-x}Ge_x$ crystal layer, on and after the second diffraction peak patterns on both sides of the zero diffraction peak are unclear after the heat treatment, so that the crystalline of the $Si_{1-x}Ge_x$ crystal layer is considered to be deteriorated. This result holds true for FIG. 20(c).

Figure 1:
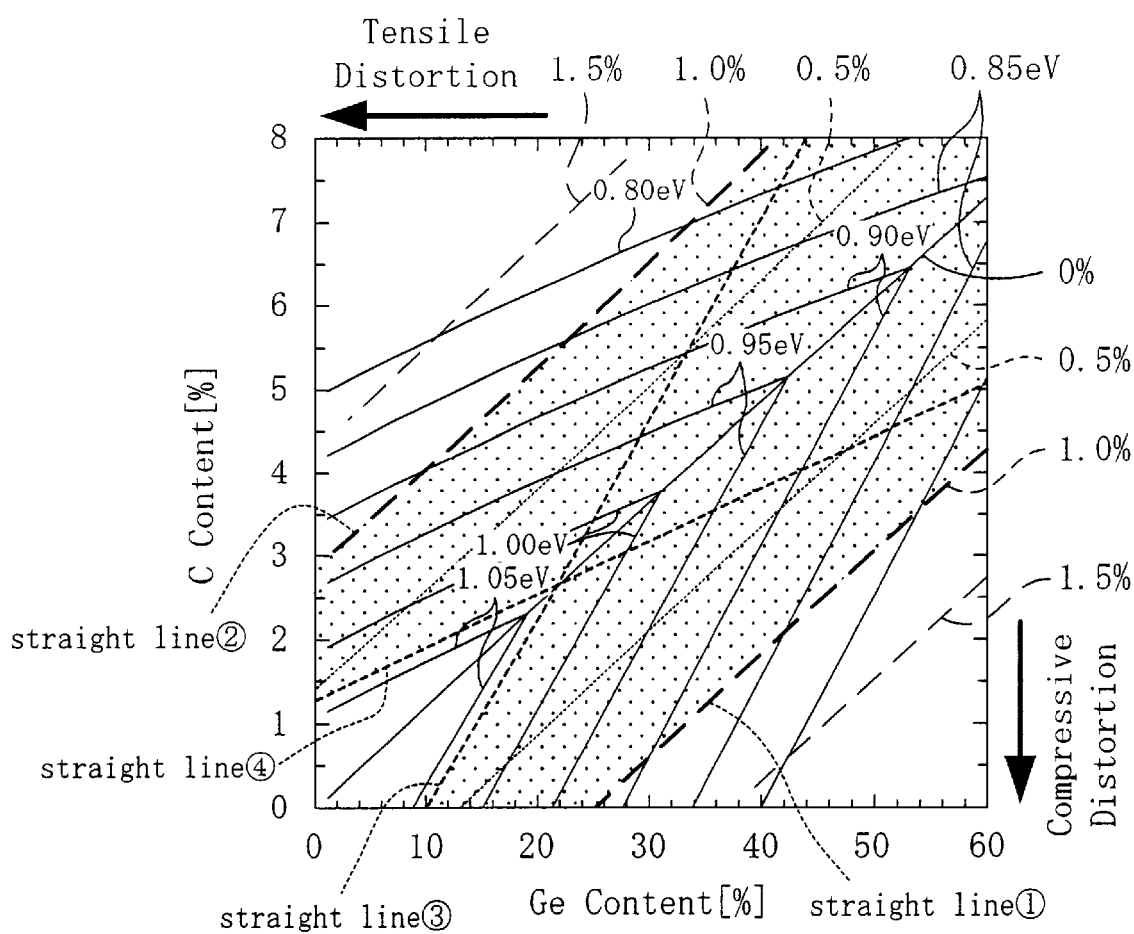
FIG. 1 is a state diagram showing the relation between the Ge and C contents, band gap and lattice strain in a SiGeC ternary mixed crystal semiconductor.

FIG. 1 is a state diagram showing the relation between the Ge and C contents, band gap and lattice strain in a SiGeC ternary mixed crystal semiconductor. In this diagram, the horizontal and vertical axes indicate the Ge content and the C content, respectively, and straight lines indicate composition requirements for keeping the amount of strain (including compressive and tensile strains) and band gap constant. As the data in FIGS. 19, and 20(a) to 20(d) show, the dot-hatched region in FIG. 1 is the region where the amount of lattice strain in the SiGeC layer on the Si layer is less than 1.0% and the band gap can be narrower than the band gap of the prior art practical SiGe (having a Ge content of about 10%). When the Ge and C contents in SiGeC represented by $Si_{1-x-y}Ge_xC_y$ are made x and y, respectively, the above-mentioned region is surrounded by the following four straight lines:

Straight line ①: y=0.122x−0.032
Straight line ②: y=0.1245x+0.028
Straight line ③: y=0.2332x−0.0233 (Ge content is 22% or less)
Straight line ④: y=0.0622x+0.0127 (Ge content is 22% or less)

In the diagram, the SiGeC layer having the composition shown on the straight line with a 0% lattice strain is lattice-matched with the underlying Si layer.

Consequently, in a heterojunction bipolar transistor consisting of an emitter, base and collector layers, making the base layer from the SiGeC having the composition shown in the dot-hatched region of FIG. 1 realizes a narrow band gap base which has been a practical problem due to lattice strain.

As a result, according to the present invention, using SiGeC ternary mixed crystal semiconductor material having a narrow band gap and causing a small amount of lattice strain for the base layer makes it possible to realize a highly reliable heterojunction bipolar transistor which can operate at a low voltage and a high speed.

Although FIG. 1 shows the case where the underlying layer of the SiGeC layer is composed of Si only, the same effects could be obtained when the underlying layer contains some Ge or C besides Si as long as the lattice strain of the SiGeC layer is 1.0% or less and a large difference in band gap is secured between the underlying layer and the SiGeC layer.

Figure 2:
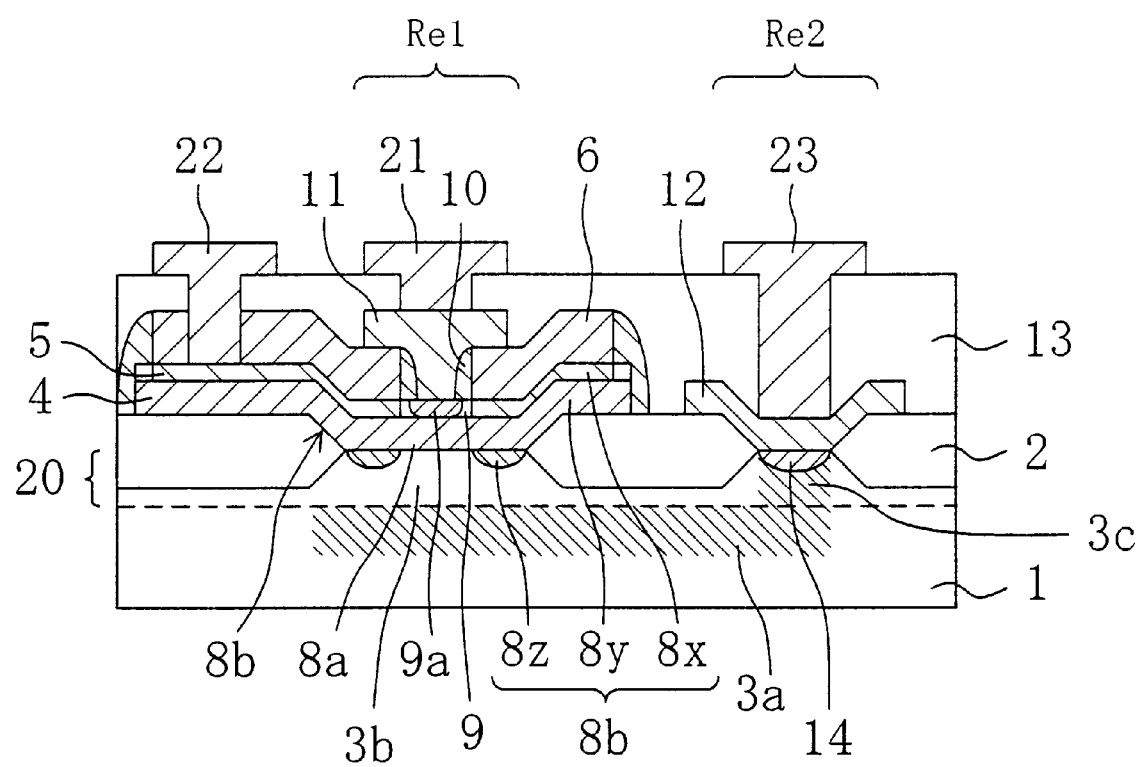
FIG. 2 is a cross sectional view of the heterojunction bipolar transistor in the embodiments of the present invention.

The Entire Structure of the Heterojunction Bipolar Transistor and an Example of its Fabrication Processes FIG. 2 shows a cross sectional view of a heterojunction bipolar transistor of the present invention which has a collector layer made from Si crystal and a base layer made from SiGeC crystal.

As shown in FIG. 2, a first active region Re1 and a second active region Re2 surrounded by a LOCOS film 2 are provided on a Si substrate 1. A sub collector layer 3a containing an n-type impurity is formed in such a manner as to extend between the first active region Re1 and the second active region Re2 inside the Si substrate 1. Also, a Si epitaxial layer 20, which is an epitaxially grown first semiconductor layer, is provided on the sub collector layer 3a in the Si substrate 1. Of the Si epitaxial layer 20, the first active region Re1 and the second active region Re2 have a collector layer 3b and a collector wall layer 3c, respectively. Furthermore, a SiGeC layer 4 as a second semiconductor layer, and a Si layer 5 as a third semiconductor layer are epitaxially grown in this order on the first active region Re1 of the Si epitaxial layer 20. It must be noted that the SiGeC layer 4 and the Si layer 5 become single crystalline films on the portion where the Si epitaxial layer on the substrate is exposed, but become polycrystalline films on the LOCOS film 2. The region above the collector layer 3b in the SiGeC layer 4 is an intrinsic base layer 8a containing a p-type impurity. In the region beside the intrinsic base layer 8a, an external base layer 8b is formed in such a manner as to extend throughout each portion of 8x, 8y and 8z in the SiGeC layer 4, the Si layer 5 and the Si substrate 1, respectively. Moreover, an emitter layer 9 containing an n-type impurity is formed in the region above the intrinsic base layer 8a in the Si layer 5.

The boundary between the intrinsic base layer 8a and the collector layer 3b is shown by a single line in FIG. 2; however, in reality, the PN junction, which becomes the boundary between the base and the collector changes in accordance with the state the impurity has been introduced. Consequently, the boundary between the intrinsic base 8a and the collector layer 3b and the boundary between the Si epitaxial layer 20 and the SiGeC layer 4 hardly coincide with each other. This holds true for the positional relation between the boundary of the intrinsic base layer 8a and the emitter layer 9 and the boundary of the SiGeC layer 4 and the Si layer 5. The positional relation between the boundary of the Si epitaxial layer 20, the SiGeC layer 4 and the Si layer 5, and the boundary of the collector layer 3b, the intrinsic base layer 8a and the emitter layer 9 will be detailed below.

Furthermore, a BSG (Boron Silicate Glass) film 6 containing a high-concentration p-type impurity is provided on the Si layer 5, and the external base layer 8b is doped with boron, which is a p-type impurity diffused from the BSG film 6. A sidewall made from a silicon oxide is formed on the side surfaces of the opening of the BSG film 6, and an emitter electrode 11 made from polysilicon containing a high-concentration n-type impurity (like phosphorus) is formed inside the opening. A high-concentration emitter layer 9a made by diffusing an n-type impurity (like phosphorus) into the emitter layer 9 from the emitter electrode 11 is formed. It must be noted that an n-type impurity (phosphorus or arsenic) can be introduced in the emitter layer 9 previously by being doped in-situ during the epitaxial growth.

On the second active region Re2 in the Si substrate 1, a collector electrode 12 containing an n-type impurity (like phosphorus) is formed. A collector contact layer 14 containing the n-type impurity diffused from the collector electrode 12 is formed on the collector wall layer 3c.

An interlevel insulator film 13 made from a silicon oxide is formed on the main surface of the substrate, and Al interconnections 21, 22 and 23 are formed to be connected to the emitter electrode 11, the Si layer 5 and the collector electrode 12, respectively, via contact holes formed on the interlevel insulating film 13. The portion of the polycrystalline film of the Si layer 5 and the SiGeC layer 4 leads to the external base layer 8b formed in the crystal film portion, and functions as a so-called base electrode.

In the heterojunction bipolar transistor of this example, the BSG film 6 for impurity doping having an opening is formed on the SiGeC layer 4 and the Si layer 5 which are epitaxially grown, and the external base layer 8b is formed by diffusing boron, which is an p-type impurity, from the BSG film 6, and the high-concentration emitter layer 9a is formed by diffusing the N-type impurity into the emitter layer 9 from the emitter electrode 11 formed in the opening of the BSG film 6. Thus, each of the external base layer 8b and the high-concentration emitter layer 9a is formed in a self-aligned manner in the opening of the BSG film 6. It is not necessary that both the external base layer 8b and the high-concentration emitter layer 9a are formed in a self-aligned manner in the opening of the BSG film 6.

A method for fabricating the heterojunction bipolar transistor of the present embodiment will be described as follows with reference to FIGS. 3(a) to 3(k).

Figure 3A:
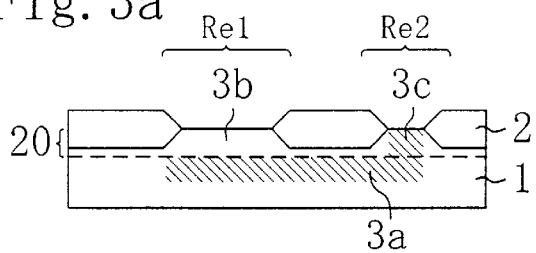
FIGS. 3(a) to 3(k) are cross sectional views showing the fabrication processes of the heterojunction bipolar transistor in the embodiments of the present invention.

First, in the process of FIG. 3(a), after the sub collector layer 3a implanted with a high-concentration n-type impurity is formed inside the Si substrate 1, the Si epitaxial layer 20 containing a low-concentration n-type impurity is epitaxially grown by a LP-CVD process, then the LOCOS film 2 surrounding the first and second active regions Re1 and Re2 onto the Si epitaxial layer 20 are formed. The epitaxially grown Si epitaxial layer 20 becomes the collector layer 3b in the first active region Re1, and becomes the collector wall layer 3c in the second active region Re2.

Figure 3B:
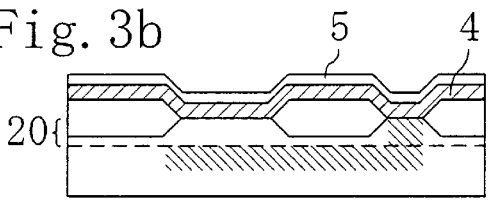

In the process of FIG. 3(b), an about 50 nm-thick p-type SiGeC layer 4 doped with boron at portions other than its top end portion and bottom end portion, and an about 20 nm-thick Si layer 5 not doped with anything are epitaxially grown in this order onto the entire surface of the substrate by a UHV-CVD process. In this case, the SiGeC layer 4 and the Si layer 5 are single crystalline films on the portion where the silicon surface is exposed, and are polycrystalline films on the LOCOS film 2. In growing the SiGeC layer 4, in a UHV-CVD device, the flow rates of disilane ($Si_2H_6$), germane ($GeH_4$) and methylsilane (10% $SiH_3CH_3/H_2$) are set at 7.5 ml/min., 20 ml/min. and 10 ml/min., respectively, and the temperature and pressure of the growth are set at 500° C. and 0.53 Pa($4\times10^{-3}$ Torr), respectively. Ingrowing the Si layer 5, in the UHV-CVD device, the flow rate of disilane ($Si_2H_6$) is set at 7.5 ml/min., and the temperature and pressure of the growth are set at 550° C. and 0.27 Pa($2\times10^{-3}$ Torr), respectively. In addition, the timing at which boron is introduced during the epitaxial growth of the SiGeC layer 4 is so controlled as to adjust the positional relation between the collector-base junction and the boundary of the Si layer 5 and the SiGeC layer 4.

When the Si layer 5 (Si single crystalline film and Si polycrystalline film) is epitaxially grown, a relatively high concentration of a n-pe impurity (phosphorus or arsenic) may be introduced by being doped in-situ.

Figure 3C:
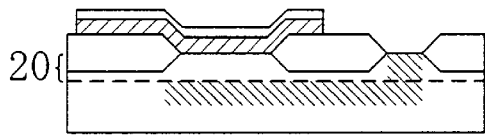

In the process of FIG. 3(c), of the SiGeC layer 4 and the Si layer 5, other portions than the portion which functions as the active base layer and the drawing base electrode are eliminated by dry etching.

Figure 3D:
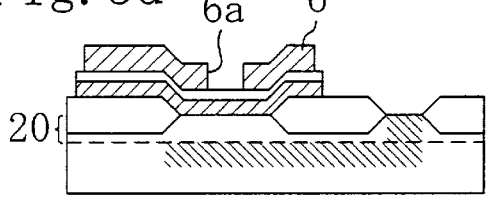
Figure 3E:
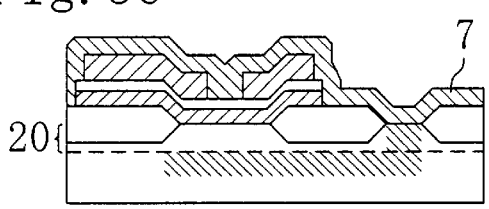

In the process of FIG. 3(d), after the BSG film 6 having a thickness of about 200 nm and containing about 8% of boron is deposited by an atmospheric pressure CVD onto the entire surface of the substrate, the BSG film 6 is patterned by a photolithography process and a dry etching process so as to eliminate the second active region Re2 entirely and to form an opening 6a for emitter electrode formation on the first active region Re1. In the process of FIG. 3(e), an about 100 nm-thick protective nitride film 7 is deposited on the entire surface of the substrate by the CVD process. During the diffusion of boron in the next process, the protective nitride film 7 prevents boron from coming out of the BSG film 6 into the vapor phase and adhering to the exposed portion of the silicon surface to diffuse in the substrate.

Figure 3F:
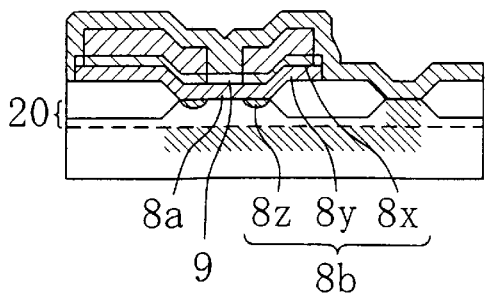

In the process of FIG. 3(f), a heat treatment is performed for 10 seconds at 950° C. in accordance with a RTA (Rapid Thermal Anneal) process, in order to diffuse boron in the BSG film 6 into the portion below the BSG film 6 in the Si layer 5 (the portion around the opening 6a), the portion below the BSG film 6 in the SiGeC layer 4 and the portion below the BSG film 6 in the collector layer 3b. In this process, the portions 8x and 8z below the BSG film 6 in the Si layer 5 and the collector layer 3b (the portion around the opening 6a) become p type, and the portion 8y below the BSG film 6 in the SiGeC layer 4 has a higher-concentration p-type impurity to have lower resistance. As a result, in the portion around the opening 6a, the external base layer 8b is formed in such a manner as to extend throughout the portions 8x, 8y and 8z in the Si layer 5, the SiGeC layer 4 and the collector layer 3b. As shown in FIGS. 19 and 20(a) to 20(d), the crystalline of the SiGeC layer of the present invention is maintained well without deterioration.

Figure 3G:
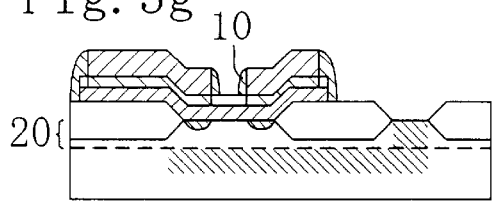

In the process of FIG. 3(g), the protective nitride film 7 is etch backed by anisotropic dry etching to form the sidewall 10 on the sides of the BSG film 6. The sidewall 10 secures the pressure resistance of the high-concentration emitter layer and the external base layer which will be formed below.

Figure 3H:
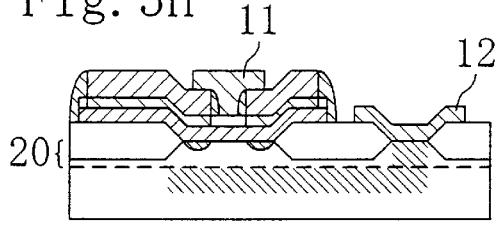

In the process of FIG. 3(h), after a polysilicon film doped with high-concentration phosphorus, which is to be the emitter electrode and the collector electrode, is deposited by a LPCVPD process, the polysilicon film is patterned by dry etching to form the emitter electrode 11 and the collector electrode 12 onto the first active region Re1 and the second active region Re2, respectively.

Figure 3I:
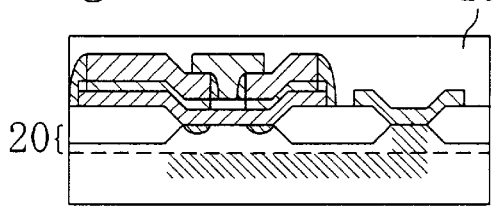

In the process of FIG. 3(i), the interlevel insulating film 13 made from a silicon oxide is deposited by the CVD process.

Figure 3J:
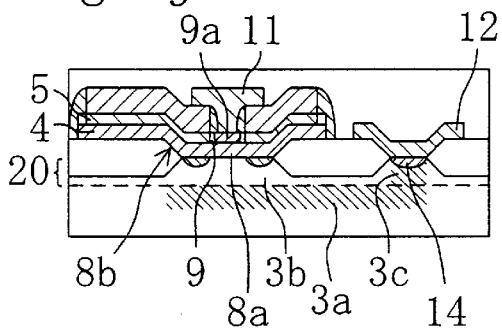

In the process of FIG. 3(j), the high-concentration emitter layer 9a is formed by diffusing phosphorus to the emitter layer 9 and the top end portion of the SiGeC layer 4 from the emitter electrode 11 by the heat treatment (RTA) for 10 seconds at 950° C. Also, the collector contact layer 14 is formed by diffusing phosphorus into the collector wall layer 3c from the collector electrode 12. In this case, as shown in FIGS. 19 and 20(a) to 20(d), the crystalline of the SiGeC layer of the present invention is maintained well without deterioration.

Figure 3K:
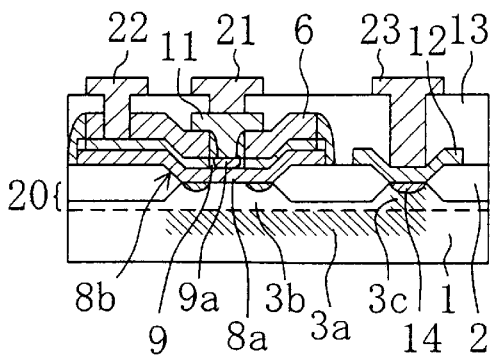

In the process of FIG. 3(k), after contact holes which reach the emitter electrode 11, the Si layer 5 and the collector electrode 12, respectively, are formed in the interlevel insulating film 13 by dry etching, the Al interconnections 21, 22 and 23 are formed in such a manner as to extend from inside each contact hole onto the interlevel insulating film 13.

In each of the following embodiments, the structure of the emitter, base and collector layers will be described by taking as an example the heterojunction bipolar transistor with the structure shown in FIG. 2 and fabricated through the processes shown in FIGS. 3(a) to 3(k), while referring to the properties including the composition and tensile strains and band gap shown in FIG. 1. It must be noted that the structure and fabrication processes of the heterojunction bipolar transistor of the present invention are not limited to the one shown in FIG. 2 or those shown in FIGS. 3(a) to 3(k).

(Embodiment 1)

First, the SiGeC-HBT of the present embodiment which includes the intrinsic base layer 8a made of the SiGeC layer 4 having a uniform composition will be described.

Figure 4A:
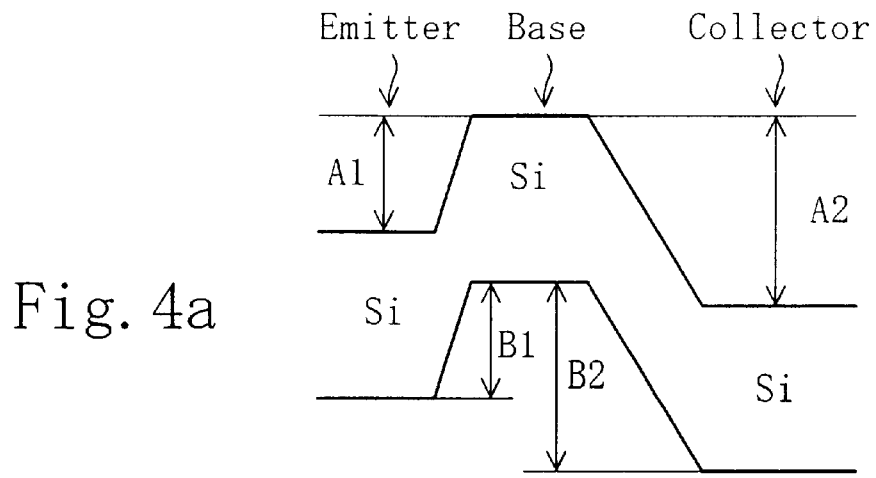
FIGS. 4(a) to 4(c) show the energy band structure of a prior art NPN-type Si-BJT, the energy band structure of a prior art NPN-type SiGe-HBT having a base layer with a uniform composition and the energy band structure of a NPN-type SiGeC-HBT having a SiGeC base layer with a uniform composition of the embodiments, respectively.
Figure 4B:
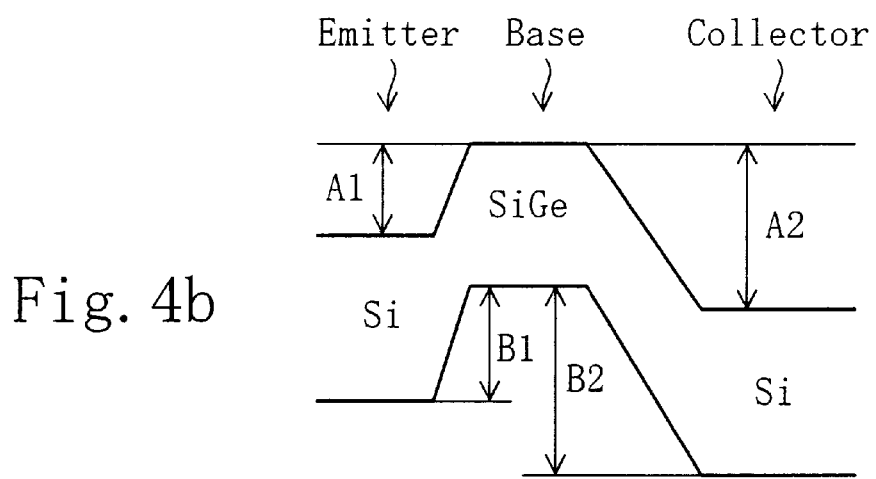
Figure 4C:
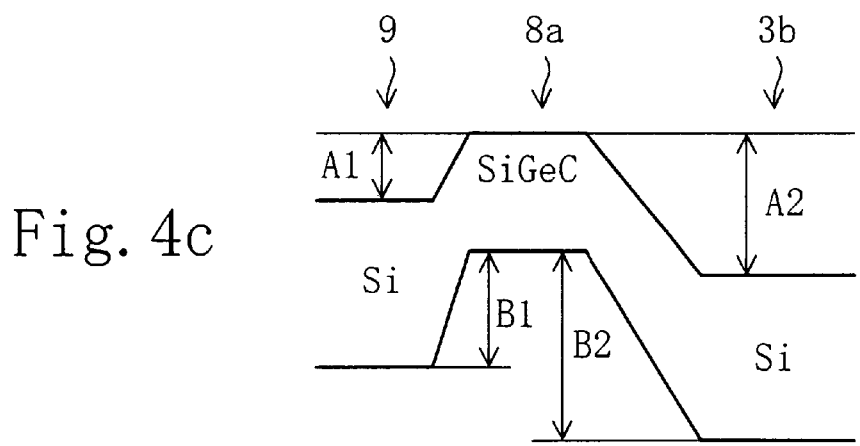

FIGS. 4(a) to 4(c) show the energy band structure of the prior art NPN-type Si-BJT, the energy band structure of the prior art NPN-type SiGe-HBT having a base layer with a uniform composition and the energy band structure of the NPN-type SiGeC-HBT of the present invention having a SiGeC base layer with a uniform composition, respectively.

In the prior art NPN-type Si-BJT shown in FIG. 4(a), between the emitter and the base, the potential difference A1 between the conduction bands is equal to the potential difference B1 between the valence bands. Between the base and the collector, the potential difference A2 between the conduction bands is equal to the potential difference B2 between the valence bands.

In contrast, in the prior art NPN-type SiGe-HBT shown in FIG. 4(b), between the emitter and the base, the potential difference B1 between the valence bands is larger than the potential difference A1 between the conduction bands. This indicates that the built-in potential can be reduced. Consequently, it becomes possible to reduce the voltage required to keep the flowrate of carriers (electrons in this case) flowing from the emitter to the base constant, thereby to realize low-voltage operation.

However, as mentioned above, the Ge content of the SiGe base layer is generally set at 10% or less to suppress the occurrence of dislocations due to lattice mismatch. This makes it impossible to have a very large difference in band gap between the SiGe layer and the Si layer, and further makes it impossible to have a very large difference (B1–A1) or (B2–A2) between the potential difference B1 or B2 of the valence bands and the potential difference A1 or A2 of the conduction bands. As a result, there are limits on the lower-voltage operation.

On the other hand, in the NPN-type SiGeC-HBT of the present invention shown in FIG. 4(c), between the emitter layer 9 and the intrinsic base layer 8a, the difference (B1–A1) between the potential difference B1 of the valence bands and the potential difference A1 of the conduction bands can be larger, and also between the intrinsic base layer 8a and the collector layer 3b, the difference (B2–A2) between the potential difference B2 of the valence bands and the potential difference A2 of the conduction bands can be larger than in the prior art NPN-type SiGe-HBT. Thus, in the present embodiment, the SiGeC layer 4 containing the intrinsic base layer 8a has a composition corresponding to the dot-hatched region shown in FIG. 1 so as to suppress the lattice strain in the intrinsic base layer 8a to 1.0% or less and to make the band gap smaller than that of the conventional practical SiGe layer (having a Ge content of about 10%). Consequently, achievement of the above-mentioned lower-voltage operation can be accelerated.

The following is a description of the difference in band gap between Si, SiGe and SiGeC composing the respective base layers of the prior art Si-BJT, the prior art SiGe-HBT and the SiGeC-HBT of the present invention.

In the present embodiment, the SiGeC composing the base layer has a Ge content of 30% and a C content of 2.1%. As shown in FIG. 1, this composition has a lattice strain of 1.0% or less, and the band gaps of Si, of practical SiGe and of the SiGeC of the present embodiment are as follows:

Si:1.12 eV

SiGe (Ge content 10%):1.04 eV

SiGeC (Ge content 30%, C content 2.1%): 0.95 eV

Consequently, in the heterojunction bipolar transistor containing an intrinsic base layer composed of the SiGeC layer having this composition, the base layer can have a narrower band gap than the base layer composed of Si or SiGe. As a result, as shown in FIG. 4(c), the heterojunction bipolar transistor operative at a low voltage and having a large difference (B1–A1) between the potential difference B1 of the valence bands and the potential difference A1 of the conduction bands between the emitter layer 9 and the intrinsic base layer 8a, and also having a large difference (B2–A2) between the potential difference B2 of the valence bands and the potential difference A2 of the conduction bands between the intrinsic base layer 8a and the collector layer 3b.

Figure 5:
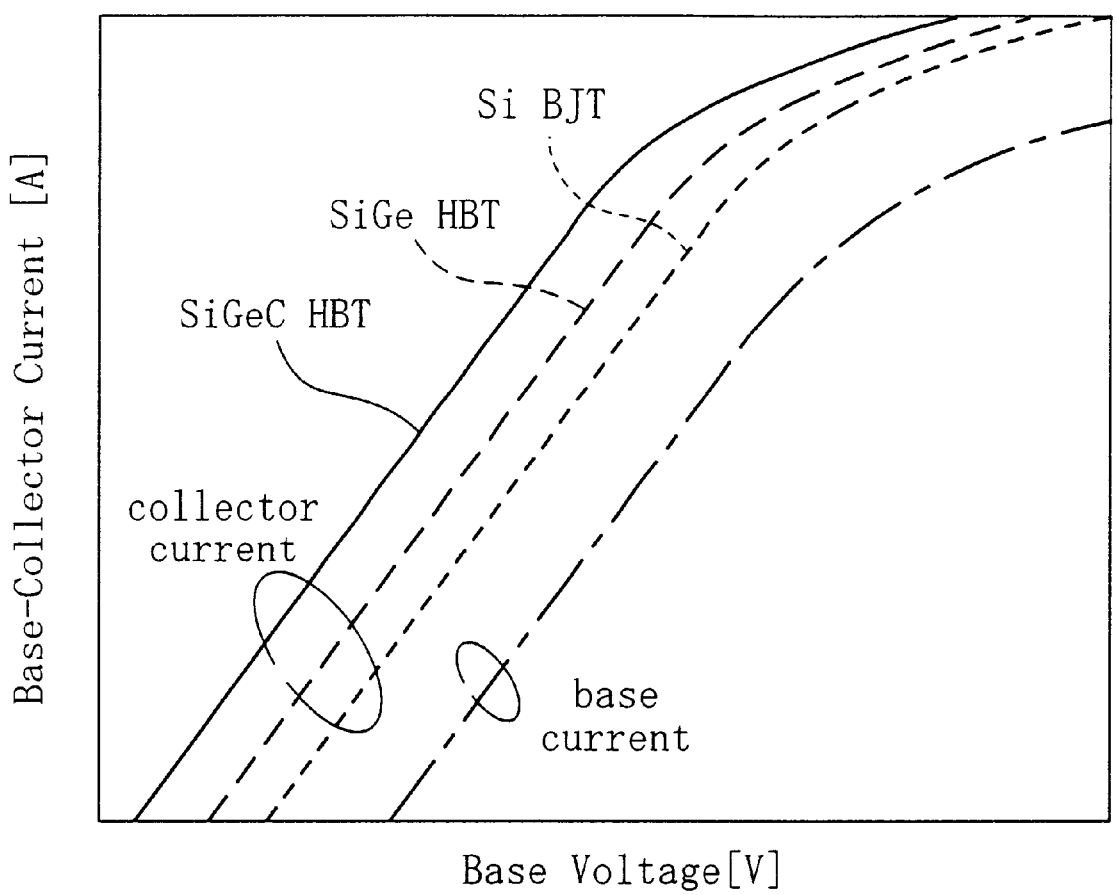
FIG. 5 is a diagram showing a comparison of the base voltage dependence characteristic (Gummel plots) of the base and collector current in the heterojunction bipolar transistor of the embodiments of the present invention to those of the prior art Si-BJT and the prior art SiGe-HBT.

FIG. 5 is a diagram showing a comparison of the base voltage dependence characteristic (Gummel plots) of the base and collector current in the heterojunction bipolar transistor of the present embodiment to those of the Si-BJT and SiGe-HBT of prior art. Provision of a heterojunction bipolar transistor with a base layer made from SiGeC having a narrow band gap as in the present embodiment reduces the built-in potential in the PN junction between the emitter and the base to obtain a larger collector current with a lower voltage than in the prior art SiGe-HBT having a uniform composition. Thus, in the SiGe-HBT of the present embodiment, operation at an unprecedentedly low voltage has been achieved.

Figure 21:
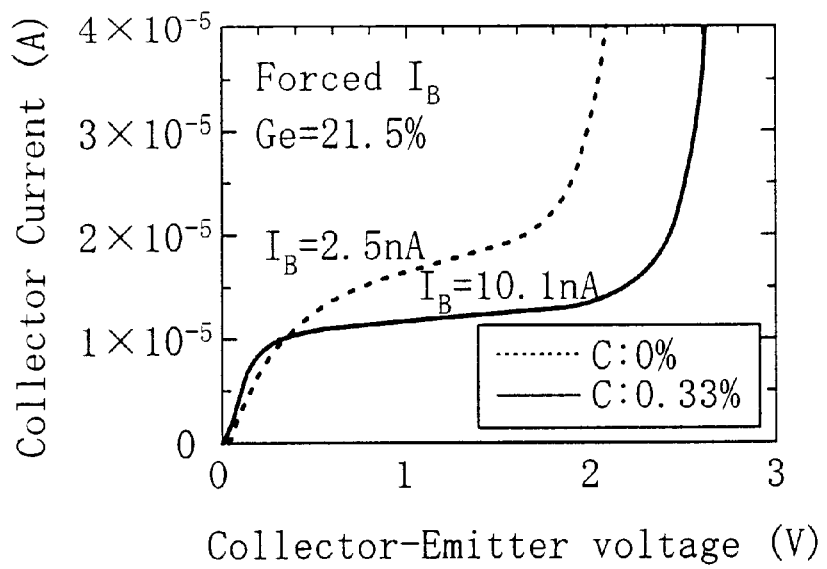
FIG. 21 is a diagram showing $V_{CE}I_C$ property in the emitter ground of the bipolar transistors having as the base layer the $Si_{1-x}Ge_x$ crystal layer and the $Si_{1-x-y}Ge_xC_y$ crystal layer with a Ge content of 21.5%.
Figure 22:
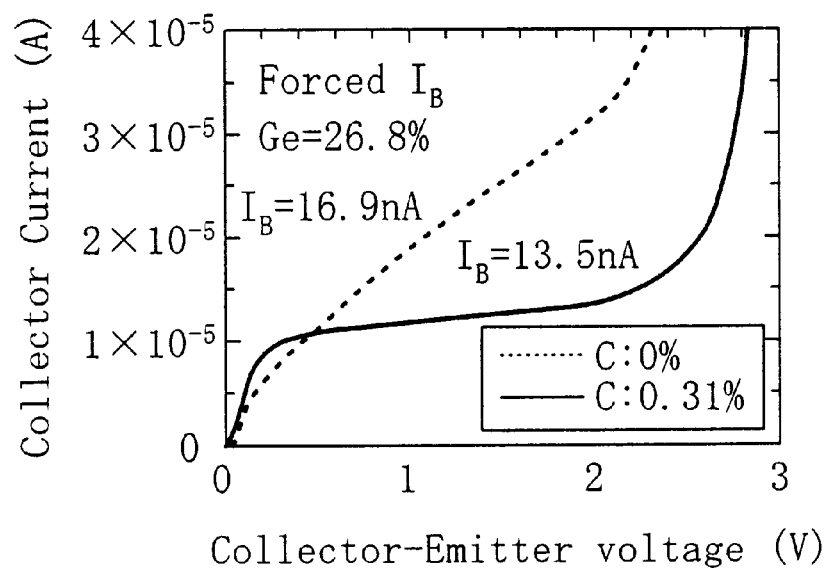
FIG. 22 is a diagram showing $V_{CE}\text{-}I_C$ property in the emitter ground of the bipolar transistors having as the base layer the $Si_{1-x}Ge_x$ crystal layer and the $Si_{1-x-y}Ge_xC_y$ crystal layer with a Ge content of 26.8%.

FIGS. 21 and 22 are diagrams showing $V_{CE}$-$I_C$ property (the relation between the collector-emitter voltage and the collector current) in the emitter grounded configuration of the bipolar transistors having as the base layer the $Si_{1-x}Ge_x$ crystal layer and the $Si_{1-x-y}Ge_xC_y$ crystal layer with a Ge content of 21.5% and 26.8%, respectively. As known from these diagrams, in the bipolar transistor using the $Si_{1-x}Ge_x$ crystal layer, there is almost no region where the collector current $I_c$ becomes nearly flat, and the collector current heavily depends on $V_{CE}$. In other words, it is hard for this bipolar transistor to perform normal amplification. This proves that the Ge content of 10% is a practical limit for the bipolar transistor using the $Si_{1-x}Ge_x$ crystal layer.

In contrast, in the bipolar transistor using the $Si_{1-x-y}Ge_xC_y$ crystal layer, there is a region where the collector current $I_c$ becomes almost flat, and the collector current does not depend on $V_{CE}$ so much. These results indicate that the bipolar transistor using the $Si_{1-x-y}Ge_xC_y$ crystal layer for the base layer can perform a stable bipolar operation even when the Ge content is as high as 21.5% or 26.8%

Structure in the Vicinity of the Boundary between the Si Layer and the SiGeC Layer The following is a description of the relation between the positions of the emitter layer 9 containing phosphorus, the intrinsic base layer 8a containing boron and the collector layer 3b containing phosphorus of the NPN-type heterojunction bipolar transistor and the positions of the Si epitaxial layer 20, the SiGeC layer 4 and the Si layer 5, with reference to FIGS. 6(a), 6(b) to FIGS. 9(a), 9(b). In these diagrams, the positions of the Si epitaxial layer 20, the SiGeC layer 4 and the Si layer 5 are distinguished by the presence or absence of Ge and C, and the positions of the emitter layer 9, the intrinsic base layer 8a and the collector layer 3b are distinguished by the presence or absence of boron. Since the Si epitaxial layer 20 and the Si layer 5 do not contain Ge or C, the boundary between the SiGeC layer 4 showing the Ge and C contents and the Si epitaxial layer 20 and the Si layer 5 is explicitly shown. The emitter layer 9 and the collector layer 3b contain no boron, so that the boundary between these layers 9 and 3b and the intrinsic base layer 8a showing the concentration profile of boron is demonstrated. FIGS. 6(a), 7(a), 8(a) and 9(a) do no show the concentration of phosphorus introduced to the emitter layer and the collector layer 3b.

FIGS. 6(b), 7(b), 8(b) and 9(b) only show the shapes of the conduction band ends and the valence band ends extending throughout the emitter layer, the intrinsic base layer and the collector layer.

Figure 6A:
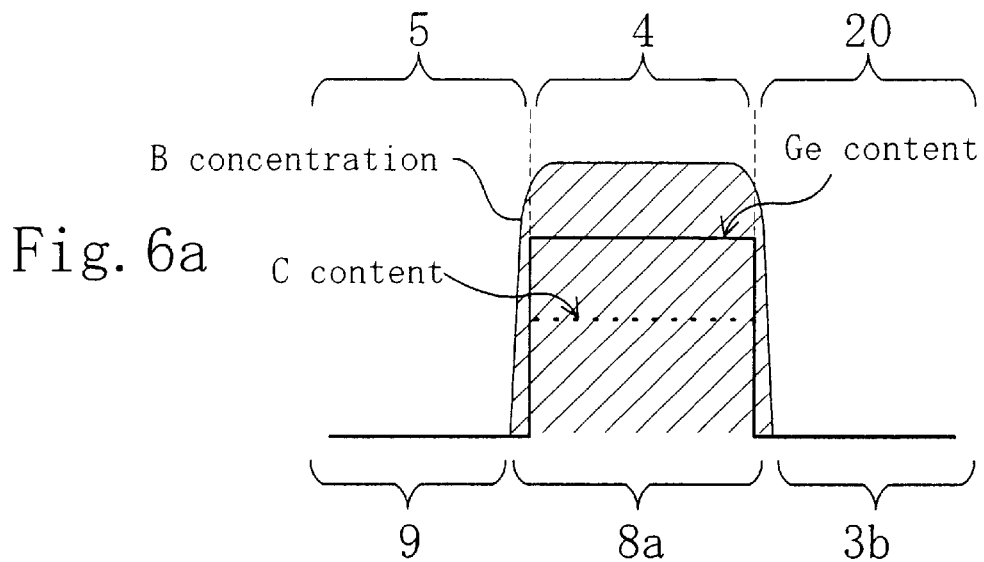
FIGS. 6(a) and 6(b) are respectively a diagram showing the relation between the position of each crystal layer of the heterojunction bipolar transistor in which boron for the base layer is doped in a wider range than the SiGeC layer having a uniform composition and the positions of the base, emitter and collector, and a diagram showing the energy band of the transistor.
Figure 6B:
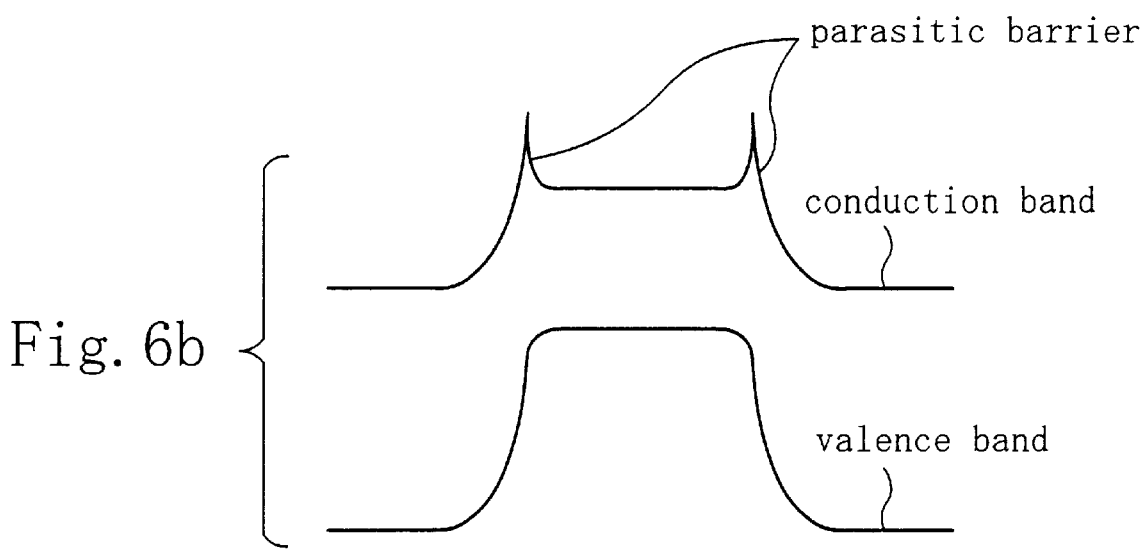

FIG. 6(a) is a diagram showing the relation between the positions of the Si epitaxial layer 20 and the Si layer 5 of the heterojunction bipolar transistor in which boron for the base layer 8a is doped in a wider range than the SiGeC layer 4 having a uniform composition, that is, in the Si epitaxial layer 20 and the Si layer 5 and the positions of the intrinsic base layer 8a, the emitter layer 9 and the collector layer 3b. FIG. 6(b) is a diagram showing the energy band of the transistor having the impurity profile shown in FIG. 6(a). As shown in FIG. 6(b), when there are an emitter-base junction and a base-collector junction outside the SiGeC layer 4, and the heterojunction interface between Si and SiGeC is formed abruptly like a stair, each junction has parasitic barriers as shown in FIG. 6(a), which inhibits the transit of the carriers and deteriorates the high frequency characteristic. Moreover, the voltage required to inject the carriers from the emitter is increased, preventing the achievement of the lower-voltage. This is because the silicon emitter layer and the silicon collector layer having a large band gap are p-type. Therefore, it is not appropriate to form the intrinsic base layer 8a as far as outside the SiGeC layer 4.

Figure 7A:
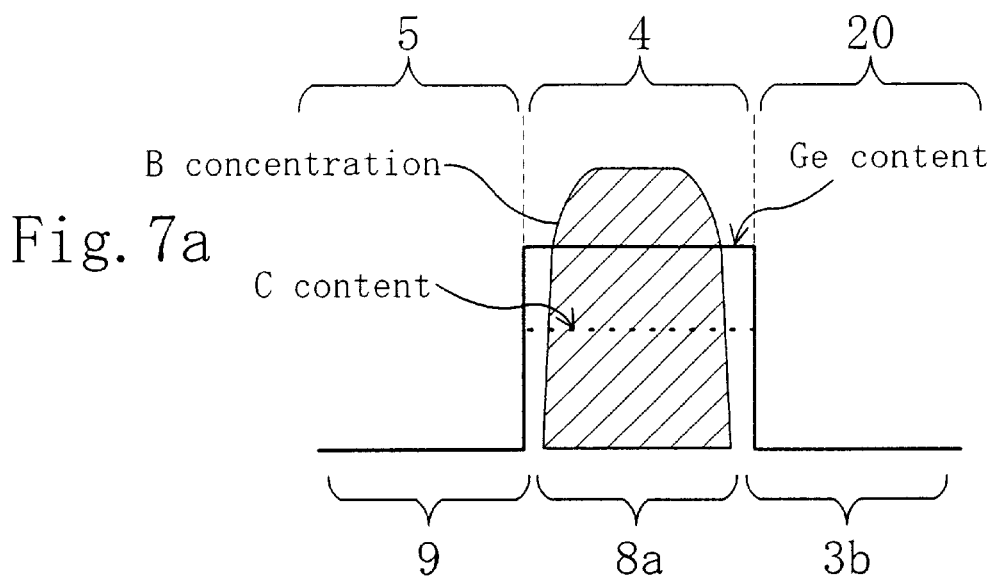
FIGS. 7(a) and 7(b) are respectively a diagram showing the relation between the position of each crystal layer of the heterojunction bipolar transistor in which boron for the base layer is doped within the SiGeC layer having a uniform composition and the positions of the base, emitter and collector, and a diagram showing the energy band of the transistor.
Figure 7B:
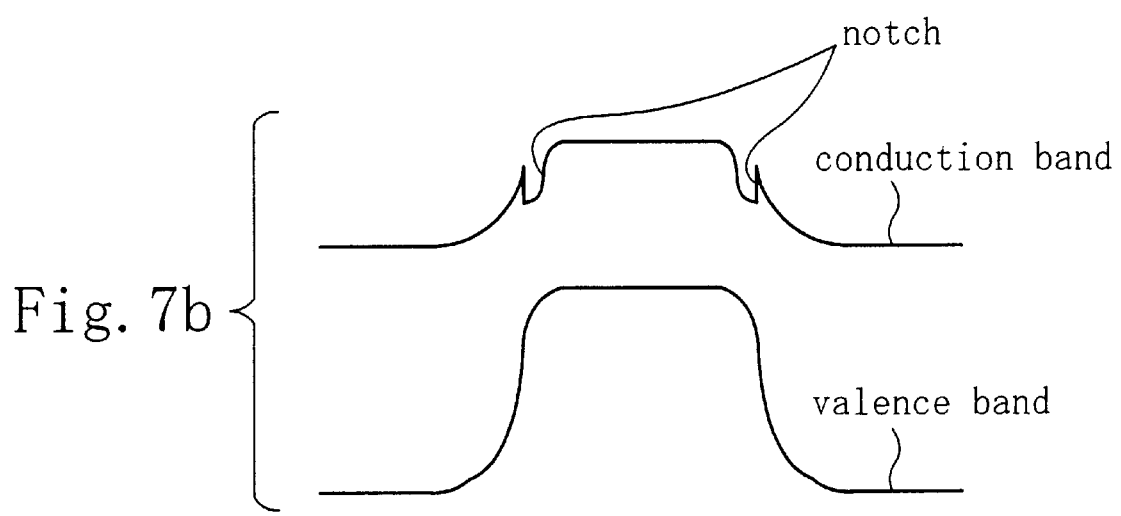

FIG. 7(a) is a diagram showing the relation between the positions of the Si epitaxial layer 20 and the Si layer 5 of the heterojunction bipolar transistor in which boron for the base layer 8a is doped within the SiGeC layer having a uniform composition and the positions of the intrinsic base layer 8a, the emitter layer 9 and the collector layer 3b. FIG. 7(b) is a diagram showing the energy band of the transistor having the impurity profile shown in FIG. 7(a). In FIG. 7(b), no parasitic barriers are formed on the heterojunction barrier shown in FIG. 7(a), but the depletion layer region of each junction has notches, which also hinder the transit of the carriers (electrons in this case). The notches are not seen in the prior art SiGe-HBT because in the prior art Si/SiGe heterojunction, a band gap difference appears as band offsets $\Delta E_v$ mainly in the valence bands, and the conduction bands have almost no potential difference, whereas in the case of the Si/SiGeC heterojunction, the band offsets $\Delta E_c$ also appear on the conduction bands. The band offsets on the conduction bands developed in the Si/SiGeC heterojunction increase with increasing C content. Consequently, the flow of the carriers (electrons in this case) from the emitter layer 9 to the collector layer 3b via the intrinsic base layer 8a itself is not hindered so much; however, the flow is slowed down by the amount of accumulation of the carriers in the parasite notches. Thus, the structure shown in FIG. 7(a) is preferable in that boron is introduced only in the SiGeC layer 4, but is not appropriate in that the SiGeC layer 4 has a uniform composition while the C content and the Ge content are kept constant.

Even if a p-type impurity such as boron extends off the SiGeC layer 4, it is essential only that the p-type region be included in the SiGeC layer 4 as a result that the region to which the n-type impurity is introduced is overlapped with the region to which the p-type impurity is introduced.

Figure 8A:
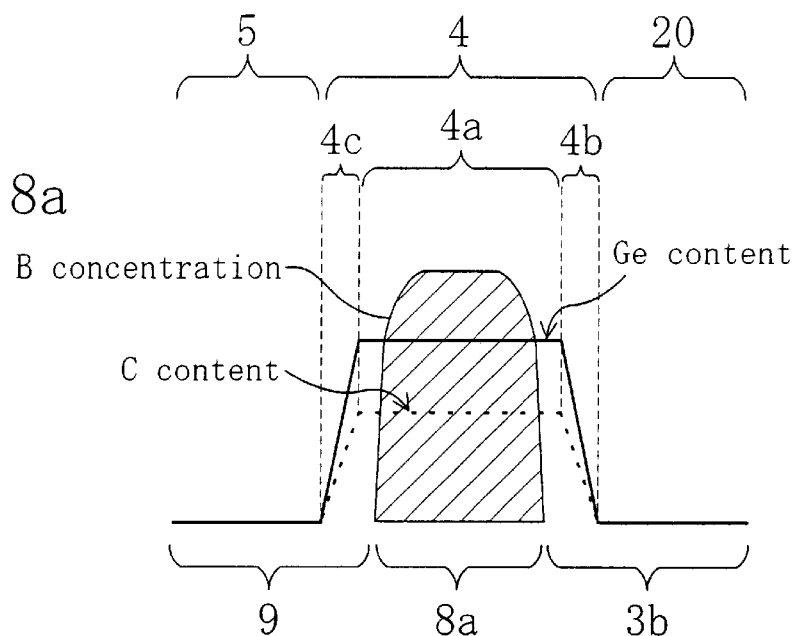
FIGS. 8(a) and 8(b) are respectively a diagram showing the relation between the position of each crystal layer of the heterojunction bipolar transistor in which boron for the base layer is exclusively doped in the SiGeC layer consisting of a center layer having a uniform composition and a top and bottom layers having a graded composition and the positions of the base, emitter and collector, and a diagram showing the energy band of the transistor.

FIG. 8(a) is a diagram showing the relation between the positions of the Si epitaxial layer 20 and the Si layer 5 of the heterojunction bipolar transistor in which boron for the base layer 8a is exclusively doped in the SiGeC layer 4 consisting of a center layer 4a having a uniform composition and a top and bottom layers 4b and 4c acting as end portions with a graded composition, and the positions of the intrinsic base layer 8a, the emitter layer 9 and the collector layer 3b. In the bottom layer 4b underlying the SiGeC layer 4, the Ge and C contents gradually decrease in the direction from the center layer 4a to the Si epitaxial layer 20. In the top layer 4c overlying the SiGeC layer 4, the Ge and the C contents gradually increase in the direction from the Si layer 5 to the center layer 4a. The intrinsic base layer 8a acting as the region with boron is included in the center layer 4a having a uniform composition where the Ge and C contents are kept constant.

It must be noted that the Ge content and the C content can change in stages instead of changing continuously. This holds true for each of the embodiments described below.

Figure 8B:
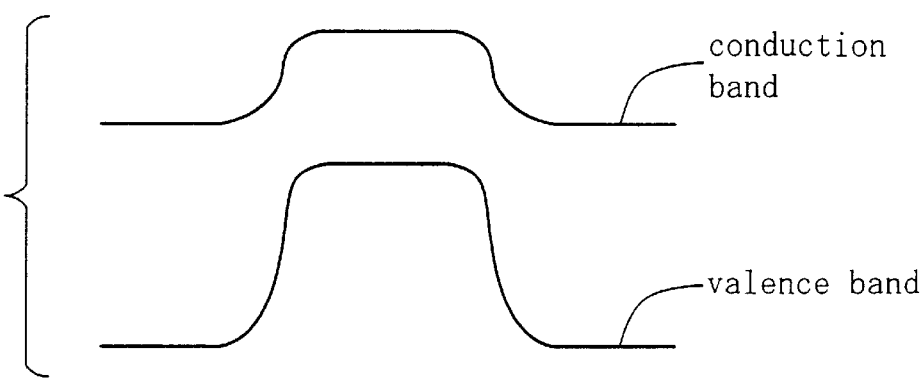

FIG. 8(b) is a diagram showing the energy band of the transistor having the impurity profile shown in FIG. 8(a). As shown in FIG. 8(b), the heterojunction barrier has no parasitic barriers or parasitic notches in this case. This diagram shows an energy band structure where the gradual change in the Ge content and the C content makes the conduction band ends change smoothly without developing an explicit potential difference. This structure results from the gradual change in the C content which may cause the band offsets at the conduction band ends in the bottom layer 4b and the top layer 4c. As a result, the flow of carriers (electrons in this case) from the emitter to the collector via the intrinsic base is neither hindered nor slowed down. By making the intrinsic base layer 8a be included in the center layer 4a of the SiGeC layer 4, and further making the Ge and C contents in the bottom layer 4b adjacent to the Si epitaxial layer 20 of the SiGeC layer 4 be gradually decreased in the direction from the center layer 4a to the Si epitaxial layer 20, it becomes possible to effectively prevent the occurrence of parasitic barriers or notches in the portion extending from the SiGeC layer 4 to the Si epitaxial layer 20 in the conduction bands of the heterojunction bipolar transistor. Similarly, by making the intrinsic base layer 8a be included in the center layer 4a of the SiGeC layer 4, and further making the Ge and C contents in the top layer 4c adjacent to the Si layer 5 of the SiGeC layer 4 be gradually increased in the direction from the Si layer 5 to the center layer 4a, it becomes possible to effectively prevent the occurrence of parasitic barriers or notches in the portion extending from the SiGeC layer 4 to the Si layer 5 in the conduction bands of the heterojunction bipolar transistor.

Even if the intrinsic base layer 8a acting as the region with boron extends between both end portions 4b, 4c of the SiGeC layer 4, no parasitic barriers are developed and the occurrence of notches can be prevented unless the intrinsic base layer 8a extends off the SiGeC layer 4.

In the bottom layer 4b and top layer 4c of the SiGeC layer 4, the Ge content and the C content can increase with some curves, instead of increasing linearly as shown in FIG. 8(a). Especially when the intrinsic base layer 8a is included in the center layer 4a of the SiGeC layer 4, the Ge content and the C content in the end regions 4b, 4c of the SiGeC layer 4 may change while shaping some stair-like portions.

Figure 9A:
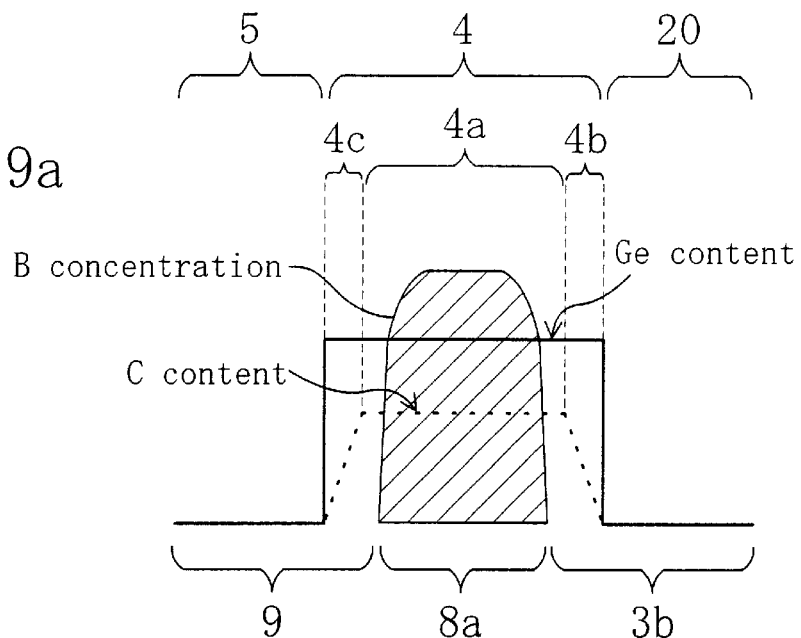
FIGS. 9(a) and 9(b) are respectively a diagram showing the relation between the position of each crystal layer of the heterojunction bipolar transistor in which boron for the base layer is exclusively doped in the SiGeC layer consisting of a center layer having a uniform composition and a top and bottom layers having a graded composition (C only), and the positions of the base, emitter and collector, and a diagram showing the energy band of the transistor.

FIG. 9(a) is a diagram showing the relation between the positions of the Si single crystalline layer 20 and the Si layer 5 of the heterojunction bipolar transistor in which boron for the base layer is exclusively doped in the SiGeC layer 4 consisting of a center layer 4a having a uniform composition and a bottom layer 4b and a top layer 4c having a graded composition (C only) and the positions of the intrinsic base layer 8a, the emitter layer 9 and the collector layer 3b. In the bottom layer 4b, the Ge content is constant and the C content gradually decreases in the direction from the Si epitaxial layer 20 to the center layer 4a. In the top layer 4c, the Ge content is constant and the C content gradually increases in the direction from the Si layer 5 to the center layer 4a. The intrinsic base layer 8a acting as the region with boron is included in the center layer 4a having a uniform composition where the Ge content and the C content are constant.

Figure 9B:
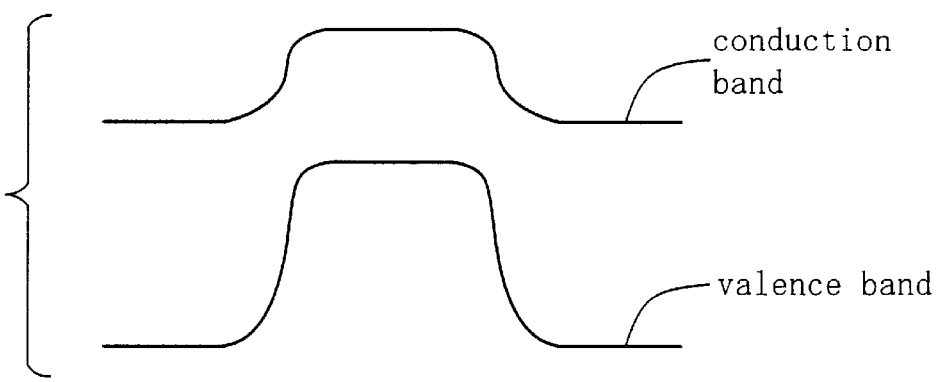

FIG. 9(b) is a diagram showing the energy band of the transistor having the impurity profile shown in FIG. 9(b). As shown in FIG. 9(b), the heterojunction barrier has no parasitic barriers or parasite notches in this case. This diagram shows an energy band structure where the gradual change in the C content makes the conduction band ends change smoothly without developing an explicit potential difference. This results from the gradual change in the C content, which may cause the band offsets at the conduction band ends in the bottom layer 4b and the top layer 4c. As a result, the flow of carriers from the emitter to the collector via the intrinsic base is neither hindered nor slowed down. By making the intrinsic base layer 8a be included in the center layer 4a of the SiGeC layer 4, and further making the C content in the bottom layer 4b adjacent to the Si epitaxial layer 20 of the SiGeC layer 4 be gradually decreased in the direction from the center layer 4a to the Si epitaxial layer 20, while keeping the Ge content constant, it becomes possible to effectively prevent the occurrence of parasitic barriers or notches in the portion extending from the SiGeC layer 4 to the Si epitaxial layer 20 in the conduction bands of the heterojunction bipolar transistor. Similarly, by making the intrinsic base layer 8a be included in the center layer 4a of the SiGeC layer 4, and further making the C content in the top layer 4c adjacent to the Si layer 5 of the SiGeC layer 4 be gradually increased in the direction from the Si layer 5 to the center layer 4a while keeping the Ge content constant, it becomes possible to effectively prevent the occurrence of parasitic barriers or notches in the portion extending from the SiGeC layer 4 to the Si layer 5 in the conduction bands of the heterojunction bipolar transistor.

Even if the intrinsic base layer 8a acting as the region with boron extends between the bottom and top layers 4b, 4c of the SiGeC layer 4, no parasitic barriers are developed and the occurrence of notches can be prevented unless the intrinsic base layer 8a extends off the SiGeC layer 4.

Thus, by composing a graded composition where the C content and the Ge content gradually change on the heterojunction interface between the SiGeC layer 4 and either the Si layer 5 or the Si epitaxial layer 20, it becomes possible to achieve a practical heterojunction bipolar transistor which excels in high frequency characteristic and is operable at a low voltage, without hindering the transit of the carriers (electrons) or causing an increase in operation voltage.

In the bottom layer 4b and top layer 4c of the SiGeC layer 4, the C content can increase with some curves, instead of increasing linearly. Especially when the intrinsic base layer 8a is included in the center layer 4a of the SiGeC layer 4, the C content in the bottom and top layers 4b, 4c of the SiGeC layer 4 may change while shaping some stair-like portions.

In the present embodiment, the intrinsic base layer 8a is composed of SiGeC ($Si_{0.679}Ge_{0.30}C_{0.021}$) having a Ge content of 30%, a C content of 2.1% and a Si content of the remaining percentage. When the SiGeC layer having this composition is epitaxially grown on the Si layer, the SiGeC layer undergoes a compressive strain of about 1.0%. The reason for choosing the composition with a compressive strain is that the system with the compressive strain, which is low in both Ge content and C content, can obtain the same degree of band gap as the band gap of the lattice-matched SiGeC layer having a high Ge content or a high C content. To be more specific, the $SiO_{0.679}Ge_{0.30}C_{0.021}$ layer of the present embodiment which has undergone a compressive strain has a band gap of 0.95 eV. In order to achieve the same narrow band gap by the lattice-matched system, the Ge content and the C content must be 42% and 5.1%, respectively. Thus, it is necessary to increase both the Ge content and the C content, which might cause the crystalline to be deteriorated with increasing C content. The above-mentioned notches are also likely to occur with increasing C content.

Figure 10:
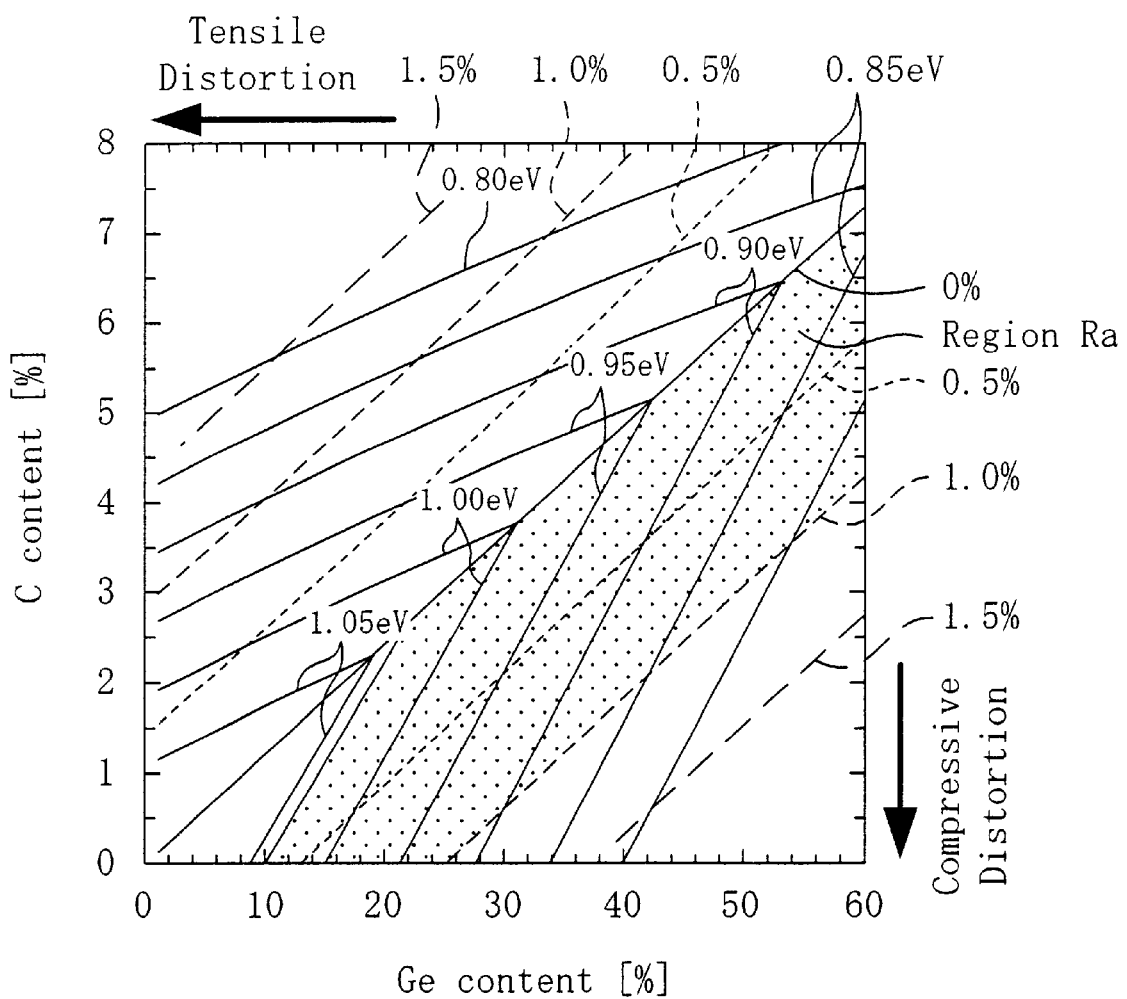
FIG. 10 is a state diagram showing the region which undergoes a compressive strain of 1.0% or less, concerning the same parameters as in FIG. 1.

FIG. 10, which is a simplified state diagram of FIG. 1, shows the region which has undergone a compressive strain of 1.0% or less. The dot-hatched region Ra shown in FIG. 10 is a region where the lattice strain undergoes a compressive strain of 1.0% or less, without including the lattice match requirements. As described above, in order to provide the intrinsic base layer with a band gap narrow enough to obtain effects while suppressing an increase in C content, it is preferable to make the base layer of a SiGeC layer having the composition shown in the dot-hatched region Ra shown in FIG. 10.

As described hereinbefore, in the heterojunction bipolar transistor having the SiGeC layer 4 epitaxially grown on the Si epitaxial layer 20, providing the intrinsic base layer 8a included in the SiGeC layer 4, and making the SiGeC layer 4 from SiGeC having a uniform composition where Ge and C are contained under the conditions that the lattice strain is 1.0% or less and the band gap is narrow makes the transistor operative at a low voltage and a high speed. Since such a Si/SiGeC system heterojunction bipolar transistor can be easily fabricated using a popular silicon process, it is easily integrated on a silicon substrate.

Although the collector layer 3b and the emitter layer 9 are made from crystal exclusively composed of Si, the present invention is not limited to this embodiment. For example, the Si epitaxial layer 20 and the Si layer 5 can contain Ge or C to have the same effects as the present embodiment as long as the lattice strain of the SiGeC layer 4 is 1.0% or less.

(Embodiment 2)

The SiGeC-HBT of the second embodiment where the intrinsic base layer 8 is composed of SiGeC having a graded composition will be described.

Figure 11A:
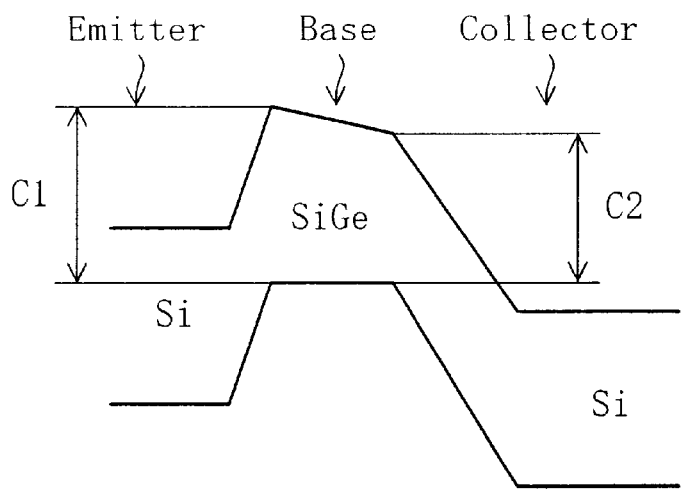
FIGS. 11(a) to 11(c) show the energy band structure of the prior art SiGe-HBT having a base layer with a graded composition, the energy band structure of the SiGeC-HBT of the second embodiment having a base layer with the graded composition and a diagram showing the Ge content, C content and boron concentration of the SiGeC-HBT of the second embodiment, respectively.
Figure 11B:
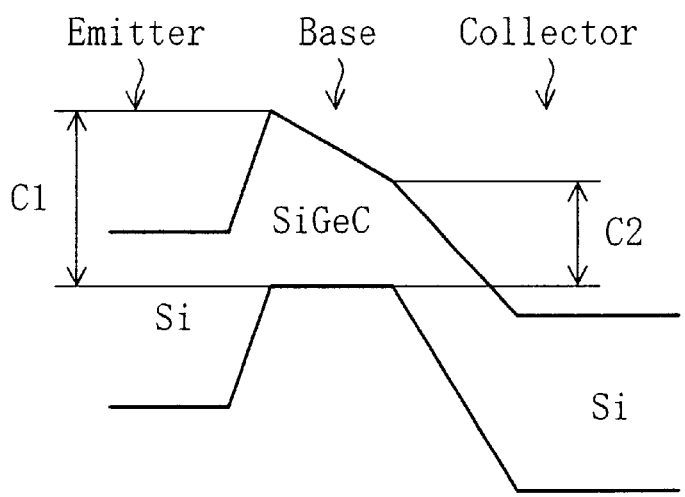
Figure 11C:
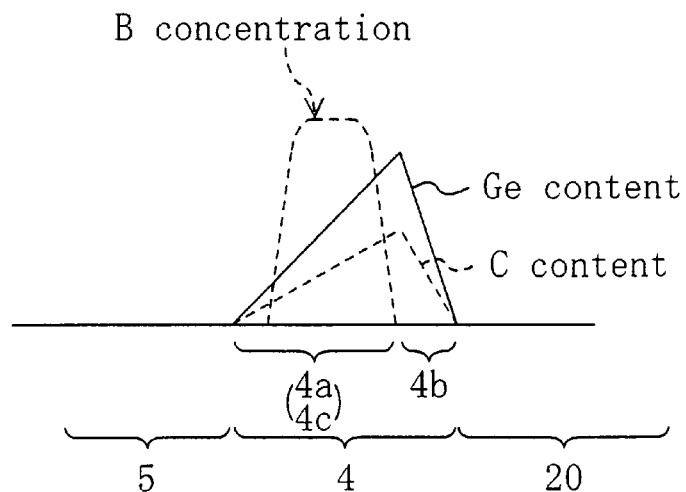

FIGS. 11(a) to 11(c) show the energy band structure of the prior art SiGe-HBT where the base layer has a graded composition, the energy band structure of the SiGeC-HBT of the present embodiment where the base layer has a graded composition and a diagram showing Ge content, C content and boron concentration of the SiGeC-HBT of the present embodiment, respectively.

In the prior art SiGe heterojunction bipolar transistor shown in FIG. 11(a), for example, the end portion of the base layer that is in contact with the emitter layer has a minimum Ge content (for example, 0%), and the end portion of the base layer that is in contact with the collector layer has a maximum Ge content (for example 10%). As a result of this structure, the band gap in the portion of the SiGe base layer that is in contact with the emitter layer can have a maximum value C1, and the band gap in the portion of the SiGe base layer that is in contact with the collector layer can have a minimum value C2. In the base layer made from SiGe having such a graded composition, the gradient at the conduction band ends causes an electric field which accelerates carriers towards the collector layer. Such a drift transit is higher in speed than the diffusion of the carriers, which makes it possible to further improve the operation speed of the heterojunction bipolar transistor. However, in this SiGe-HBT, the average lattice strain is limited to 0.5%, so that the Ge content in the portion of the base layer that is in contact with the collector layer cannot be larger than about 20%. Therefore, it has been hard to make the minimum value C2 of the band gap 0.97 eV or less. As a result, the degree of the gradient of the conduction band ends in the base layer cannot be larger than (1.12–0.97) (eV)/t =0.15 eV/t (t is the thickness of the base layer).

On the other hand, as shown in FIGS. 11(b) and 11(c), the center layer 4a of the SiGeC layer 4 containing the intrinsic base layer 8a of the present embodiment has a Ge and C contents of 0% (exclusively made from Si) in the portion that is in contact with the Si layer 5 (emitter layer), and has a Ge content of 40% and a C content of 1.0% in the portion that is in contact with the Si epitaxial layer 20 (collector layer). In the SiGeC layer 4, the Ge and C contents largely increase linearly in the direction from the Si layer 5 to the Si epitaxial layer 20. However, the ratio between the Ge content and the C content in the SiGeC layer 4 is fixed at 40:1. In the bottom layer 4b of the SiGeC layer 4, the Ge and C contents gradually decrease in the direction from the center layer 4a to the Si epitaxial layer 20. In the present embodiment, the portion of the SiGeC layer 4 that is in contact with the Si layer 5 is composed of Si only, the center layer 4a and the top layer 4c fare integrated with each other with the common composition.

In this case, the SiGeC layer having a Ge content of 40% and a C content of 1.0% has a band gap of 0.83 eV. Consequently, it becomes possible to make the gradient of the conduction band ends (1.12–0.83) (eV)/t=0.29 eV (290 meV)/t (t is the thickness of the base layer). The gradient of the conduction band ends in the SiGeC layer 4 can be further increased by changing the Ge content and the C content. Therefore, in the intrinsic base layer of the present invention composed of the SiGeC layer, the gradient of the band gap can be further increased within a range in which the average lattice strain (1.0%)(maximum lattice strain: 2.0%) causes no dislocations.

According to the heterojunction bipolar transistor of the present embodiment, the adjustment of the Ge content and the C content allows the band gap at the portion of the intrinsic base layer 8a that is in contact with the collector layer to be extremely narrow while suppressing the lattice strain in the intrinsic base layer 8a. This achieves a HBT having a large degree of gradient to decrease the band gap in the direction from the emitter side to the collector side, and having a high function of accelerating carriers using an electric field.

By forming the SiGeC layer 4 with a graded composition structure where the Ge and C contents increase linearly in the direction from the Si layer 5 (emitter side) to the Si epitaxial layer 20 (collector side), it becomes possible to realize a HBT having a high function of accelerating a graded electric field to linearly decrease the band gap from the emitter side to the collector side. To be more specific, the lattice strain in the portion of the SiGeC layer 4 that is in contact with the Si layer 5 becomes 1.2%, which is larger than the value 1.0% that can prevent the occurrence of the above-mentioned dislocations. However, when the SiGeC layer 4 has a graded composition structure, the average lattice strain throughout the SiGeC layer 4 becomes an important value. In the present embodiment, the SiGeC layer 4 has an average lattice strain of 0.6%. Since this value is less 1.0%, no dislocations are caused in the intrinsic base layer 8a, and there is no problem. In the SiGeC layer 4 containing the intrinsic base layer 8a with such a graded composition structure, there is a change in band gap of 290 mev from the emitter side end to the collector side end in the SiGeC layer 4, which delivers a higher function of accelerating the electric field for carriers (electrons in this case), thereby achieving a SiGeC-HBT capable of operating at an ultra high speed.

It is not necessary that the energy gap in the SiGeC layer 4 increases linearly in the direction from the Si layer 5 to the Si epitaxial layer 20; however, the linear increase has a particularly effective function to accelerate carriers, making it possible to provide the carriers with a fixed acceleration speed in the SiGeC layer 4.

The state where the average lattice strain throughout the SiGeC layer 4 is 1.0% or less refers to the following case. For example, when the portion of the SiGeC layer 4 composing the intrinsic base layer 8a that is in contact with the Si layer 5 (emitter side end) is composed of Si only, and there is a triangle profile where the Ge and C contents increase linearly in the direction from the portion in contact with the Si layer 5 to the portion in contact with the Si epitaxial layer 20 (collector side end), the amount of the lattice strain of the composition in the collector side end in the center layer 4a which makes the Ge and C contents at their peaks is 2% or less.

The present embodiment has so far described the case where the SiGeC layer 4 which has the composition of the region Ra (Refer to FIG. 10) undergoing a compressive strain has a graded composition. In that case, the following points should be paid attention.

Figure 12:
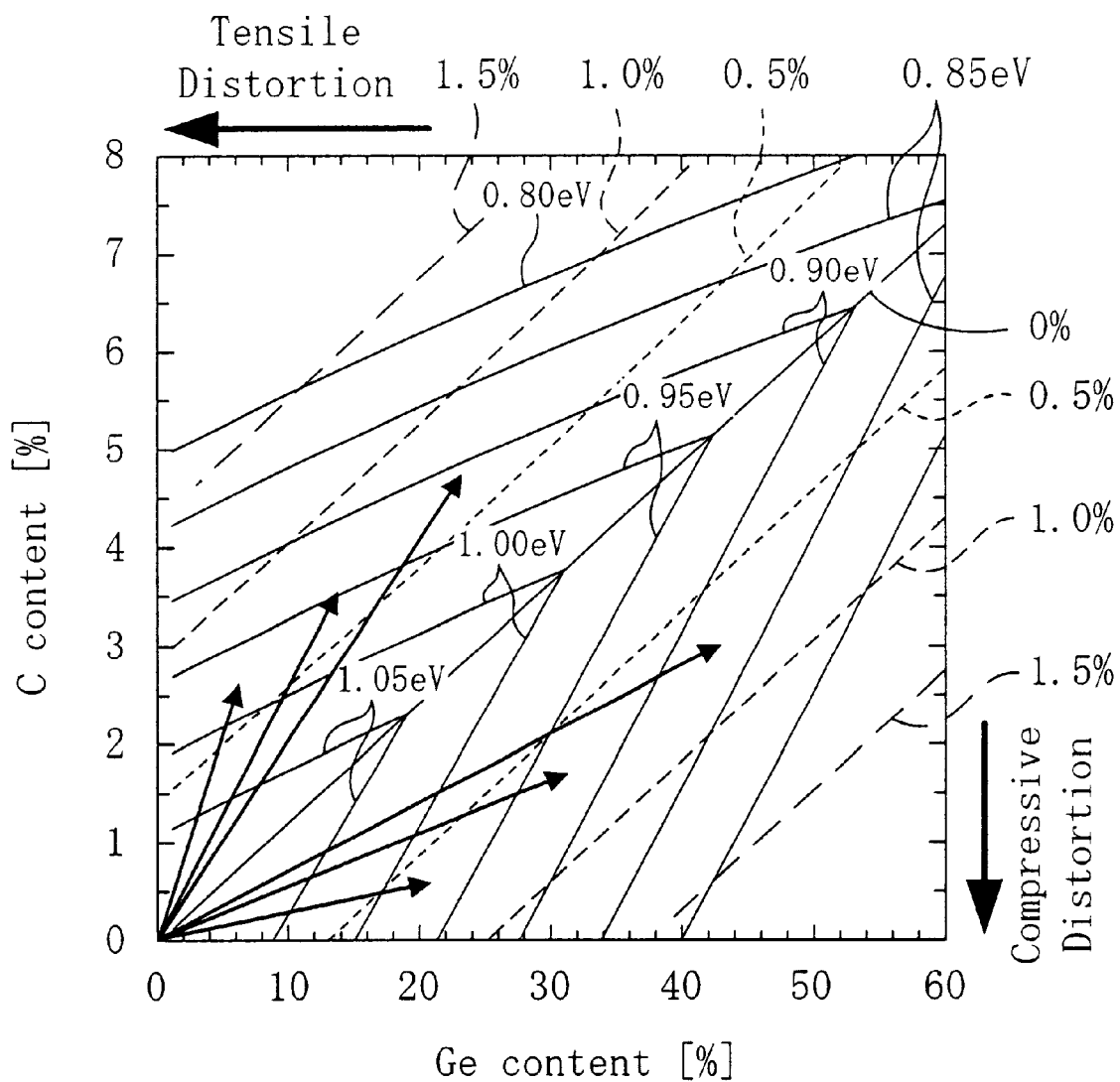
FIG. 12 is a state diagram showing the direction of changing the composition when the Ge and C contents are changed linearly while keeping the ratio between them constant in the second embodiment, concerning the same parameters as in FIG. 1.

FIG. 12 is a diagram showing the relation between the Ge and C contents, band gap and lattice strain in the same SiGeC ternary mixed crystal semiconductor as the conductor shown in FIG. 1. In the diagram, the arrows show the direction of changes in composition when the Ge and C contents are changed linearly while the ratio between them is kept constant. As known from FIG. 12, when the band gap is gradated while the SiGeC layer 4 is lattice-matched (the portion on the straight line indicating a lattice strain of 0% in FIG. 12), if the composition of the SiGeC layer 4 is slightly out of the specification due to composition control failure, the composition would change in the direction nearly perpendicular to the isobaric line of the band gap. This makes the band gap fluctuate too large to keep reproductivity. For this reason, it is preferable to provide a graded composition to either the region which has undergone the compressive strain or the region which has undergone the tensile strain in the SiGeC layer 4, and not to use the structure to gradate the band gap under the state of lattice match. From the viewpoint of crystal growth, it is preferable to have a graded composition in the region which has undergone a compressive strain in that a narrower band gap can be realized while making the Ge and C contents as small as possible.

From the reasons mentioned hereinbefore, in the SiGeC layer 4 of the present embodiment which contains the intrinsic base layer 8a, it is preferable to change the Ge and C contents within the region which undergoes a compressive strain less than the average a compressive strain of 1.0% throughout the SiGeC layer 4, not including the portion meeting the lattice match requirements (the portion on the straight line indicating a lattice strain of 0% in FIG. 12).

Furthermore, in the present embodiment, as shown in FIG. 11(c), the Ge and C contents in the bottom layer 4b of the SiGeC layer 4 are gradually decreased in the direction from the center layer 4a to the Si epitaxial layer 20. Consequently, in the same manner as in Embodiment 1, it becomes possible to prevent the occurrence of parasitic barriers (Refer to FIG. 6(a)) or notches (Refer to FIG. 7(a)) in the base-collector junction interface (the heterojunction barrier between the SiGeC layer 4 and the Si epitaxial layer 20) to suppress the development of an explicit potential difference in the conduction bands, thereby to obtain a smooth band structure.

It must be noted that only the C content in the bottom layer 4b can be decreased gradually in the direction from the center layer 4a to the Si epitaxial layer 20, and that it is not always necessary to make the bottom layer 4b have a graded composition in some types of bipolar transistors where band offsets like notches cause no serious inconvenience.

In a SiGeC-HBT of the present embodiment provided with the intrinsic base layer 8a made of the SiGeC layer 4 having the graded composition, the provision of a graded composition where the C content and the Ge content change at the Si/SiGeC heterojunction interface achieves a practical heterojunction bipolar transistor which excels in a high frequency characteristic, and not hinders the transit of the carriers.

(Embodiment 3)

The following is a description of the SiGeC-HBT of a third embodiment which includes the intrinsic base layer 8a made from SiGeC having a graded composition and has a reduced built-in potential between the emitter and the base.

Figure 13A:
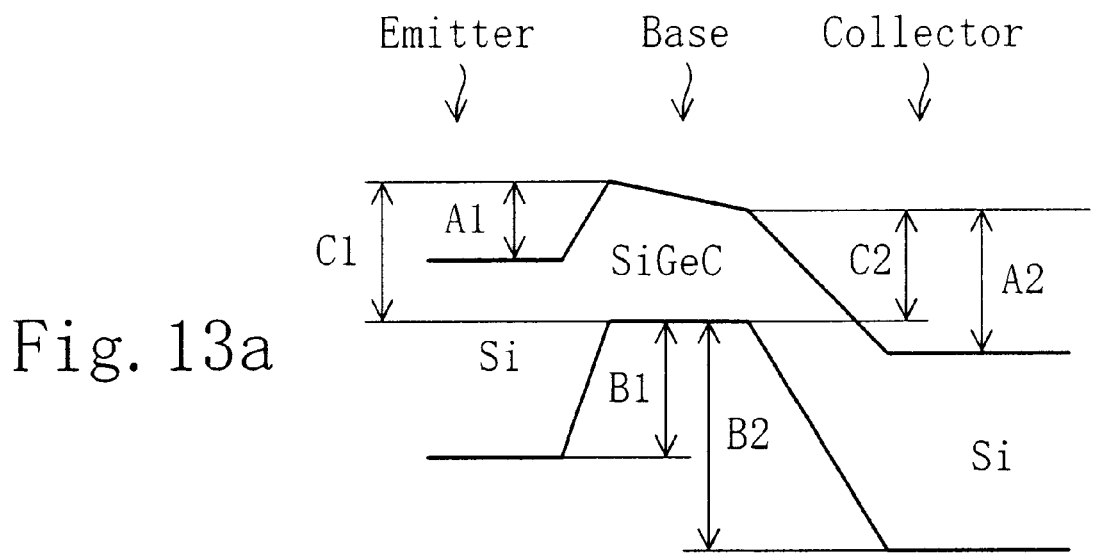
FIGS. 13(a) and 13(b) show the energy band structure of the SiGeC-HBT of the third embodiment having a graded composition and a diagram showing the Ge content, C content and boron concentration of the SiGeC-HBT, respectively.
Figure 13B:
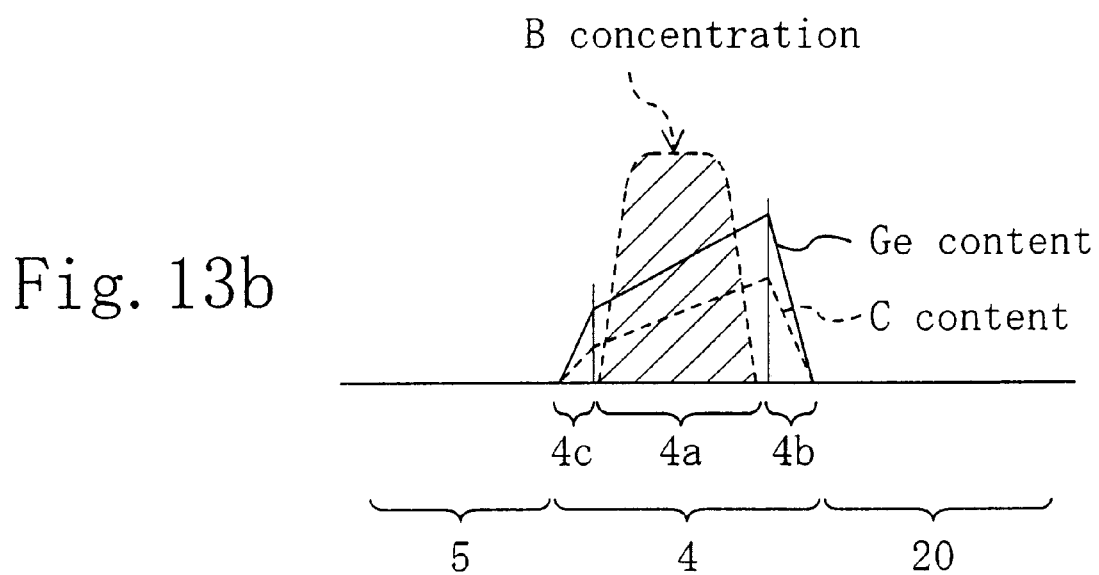

FIGS. 13(a) and 13(b) are a diagram showing the energy band structure of the SiGeC-HBT of the third embodiment having a graded composition, and a diagram showing the Ge content, C content and boron concentration of this SiGeC-HBT, respectively. In the present embodiment, of the center layer 4a of the SiGeC layer 4 composing the intrinsic base layer 8a, the portion in contact with the Si layer 5 acting as the emitter is not composed of Si only but of either SiGe or SiGeC having a narrower band gap than Si. Similarly, of the center layer 4a of the SiGeC layer 4, the portion in contact with the Si epitaxial layer 20 acting as the collector is composed of SiGeC having a narrower band gap than Si. In the bottom layer 4b of the SiGeC layer 4, the Ge content and the C content gradually decrease in the direction from the center layer 4a to the Si epitaxial layer 20. In the top layer 4c of the SiGeC layer 4, the Ge and C contents gradually increase in the direction from the Si layer 5 to the center layer 4a.

The potential difference A1 in conduction band between the SiGeC layer 4 and the Si layer 9 is made smaller than the potential difference B1 in valence band between the SiGeC layer 4 and the Si layer 9. In other words, the built-in potential of the PN junction between the emitter and the base is reduced to realize operation at a low voltage. Similar to the second embodiment, the potential difference A2 in conduction band between the SiGeC layer 4 and the Si epitaxial layer 20 is smaller than the potential difference B2 in valence band between the SiGeC layer 4 and the Si epitaxial layer 20.

In the SiGeC layer 4, the band gap C1 of the portion in contact with the Si layer 5 is larger than the band gap C2 of the portion in contact with the Si epitaxial layer 20. In other words, the band gap of the SiGeC layer 4 composing the intrinsic base layer 8a linearly decreases in the direction from the Si layer 5 (emitter side) to the Si epitaxial layer 20 (collector side). Thus, The SiGeC layer 4 has a graded composition, which causes a graded electric field in the intrinsic base layer 8a so as to accelerate the transit of the carriers in the intrinsic base layer 8a, thereby achieving high speed operation. The composition determined makes the amount of the average strain throughout the SiGeC layer 1.0% or less. The structure thus described achieves a heterojunction bipolar transistor which is operative at a low voltage and excels in high frequency characteristic.

The following is a description of the specific composition of the SiGeC layer 4 adopted in the present embodiment. Of the SiGeC layer 4, the portion in contact with the Si layer 5 (emitter side) has a Ge content of 30% and a C content of 3.3%, whereas the portion in contact with the Si epitaxial layer 20 (collector side) has a Ge content of 40% and a C content of 3.3%. Thus, both end portions of the SiGeC layer 4 have the same C content. In the SiGeC layer 4, the Ge content linearly increases in the direction from the Si layer 5 (emitter side) to the Si epitaxial layer 20 (collector side).

It is not necessary that the energy gap in the SiGeC layer 4 increases linearly in the direction from the Si layer 5 to the Si epitaxial layer 20; however, the linear increase has a particularly effective function of accelerating carriers, making it possible to provide the carriers with a fixed acceleration speed in the SiGeC layer 4.

In this case, of the SiGeC layer 4, the portion in contact with the Si layer 5 (a Ge content of 30% and a C content of 3.3%) has a band gap of 0.99 eV and a lattice strain of 0.1%, whereas the portion in contact with the Si epitaxial layer 20 (a Ge content of 40% and a C content of 3.3%) has a band gap of 0.91 eV and a lattice strain of 0.5%. As a result, the average lattice strain throughout the SiGeC layer 4 becomes about 0.3%, causing no practical problem. Making the intrinsic base layer 8a of the SiGeC layer 4 having such a composition achieves a SiGeC-HBT having an emitter-side band gap narrower than in the prior art SiGe-HBT and being operative at a low voltage and a high speed.

From the viewpoint of crystal growth, it is better to form the graded composition in the region which has undergone a compressive strain than to form it in the region with no strain to obtain a narrower band gap with a smaller C content. Therefore, the intrinsic base layer 8a of the present embodiment is also made from SiGeC which has undergone a compressive strain. Although it is already explained, when the band gap is gradated under the state of lattice match in the SiGeC layer 4 as known from FIG. 12, if the composition is slightly out of the specification due to composition control failure, the band gap fluctuates too large to keep reproductivity. For this reason, it is preferable that in either region Ra which has undergone a compressive strain or region Rb which has undergone a tensile strain, the graded composition of the SiGeC layer 4 changes in the direction from the Si layer 5 (emitter side) to the Si epitaxial layer 20 (collector side), and not to use the structure to gradate the band gap under the state of the lattice match. It must be noted that the direction of gradating the Ge and C contents is different in the case where the band gap is gradated in the region Ra which has undergone a compressive strain from the case where the band gap is gradated in the region Rb which has undergone atensile strain. The following is a description of composition gradation methods for gradating the band gap for the region Ra which has undergone a compressive strain, and composition gradation methods for gradating the band gap for the region Rb which has undergone a tensile strain.

Figure 14:
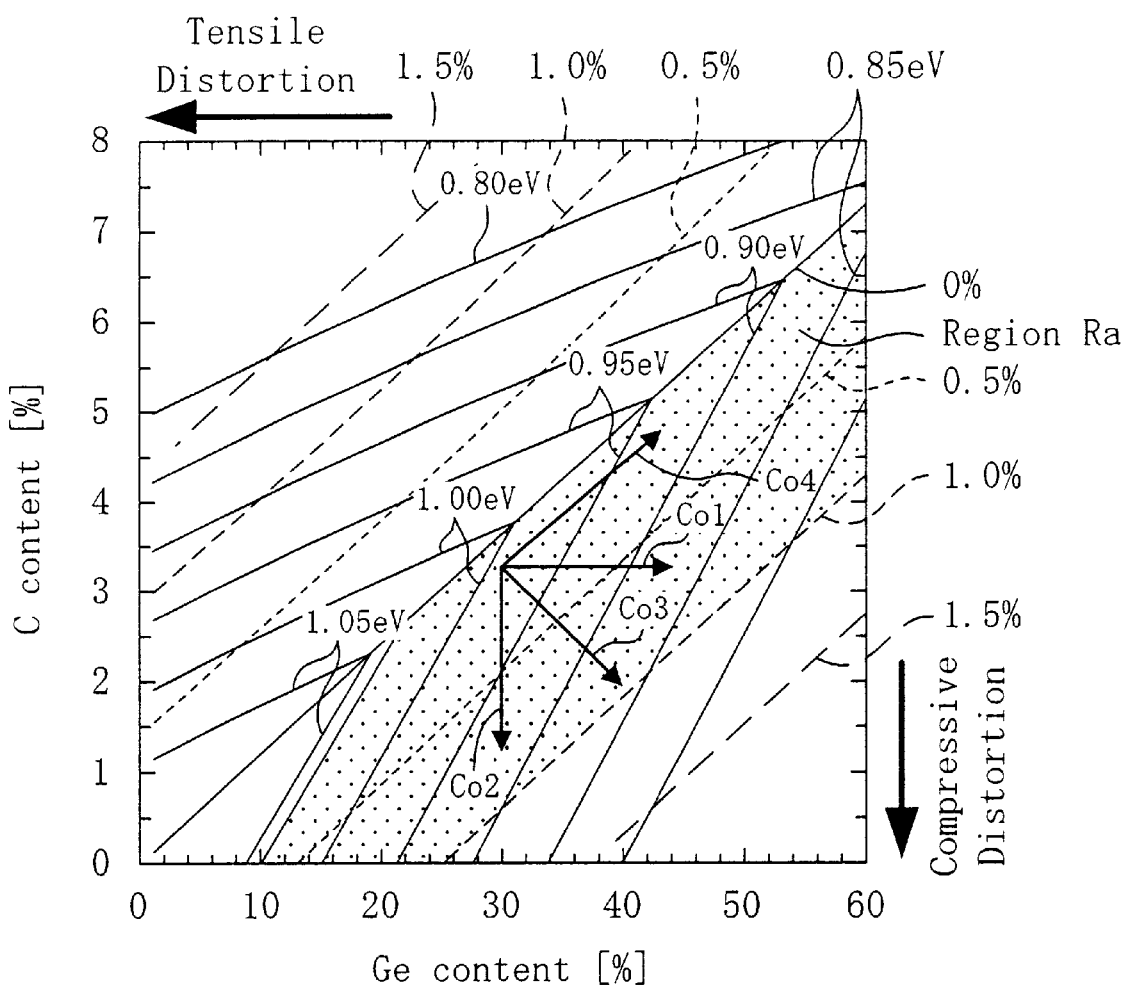
FIG. 14 is a diagram for explaining a preferable composition gradating method for gradating the band gap in the region which has undergone a compressive strain shown in the state diagram of the SiGeC layer.

Composition Gradation Methods for the Region which has Undergone a Compressive Strain FIG. 14 is a diagram for explaining preferable composition gradating methods for gradating the band gap in the region Ra which has undergone a compressive strain shown in the state diagram of the SiGeC layer 4. In order to reduce the band gap, approaches shown in straight lines Co1 to Co4 are available.

FIGS. 15(a) to 15(d) are diagrams showing composition gradating methods corresponding to straight lines Co1 to Co4, respectively shown in FIG. 14.

FIG. 15(a) is a diagram showing the case where in the SiGeC layer 4, the Ge content is linearly increased in the direction from the Si layer 5 (emitter side) to the Si epitaxial layer 20 (collector side) while the C content constant is kept constant along the straight line Co1 shown in FIG. 14.

FIG. 15(b) is a diagram showing the case where in the SiGeC layer 4, the C content is linearly decreased in the direction from the Si layer 5 (emitter side) to the Si epitaxial layer 20 (collector side) while the Ge content is kept constant along the straight line Co2 shown in FIG. 14.

FIG. 15(c) is a diagram showing the case where in the SiGeC layer 4, the Ge content is linearly increased and the C content is linearly decreased in the direction from the Si layer 5 (emitter side) to the Si epitaxial layer 20 (collector side) along the straight line Co3 shown in FIG. 14.

FIG. 15(d) is a diagram showing the case where in the SiGeC layer 4, both the Ge content and the C content are linearly increased in the direction from the Si layer 5 (emitter side) to the Si epitaxial layer 20 (collector side) along the straight line Co4 shown in FIG. 14.

Figure 16:
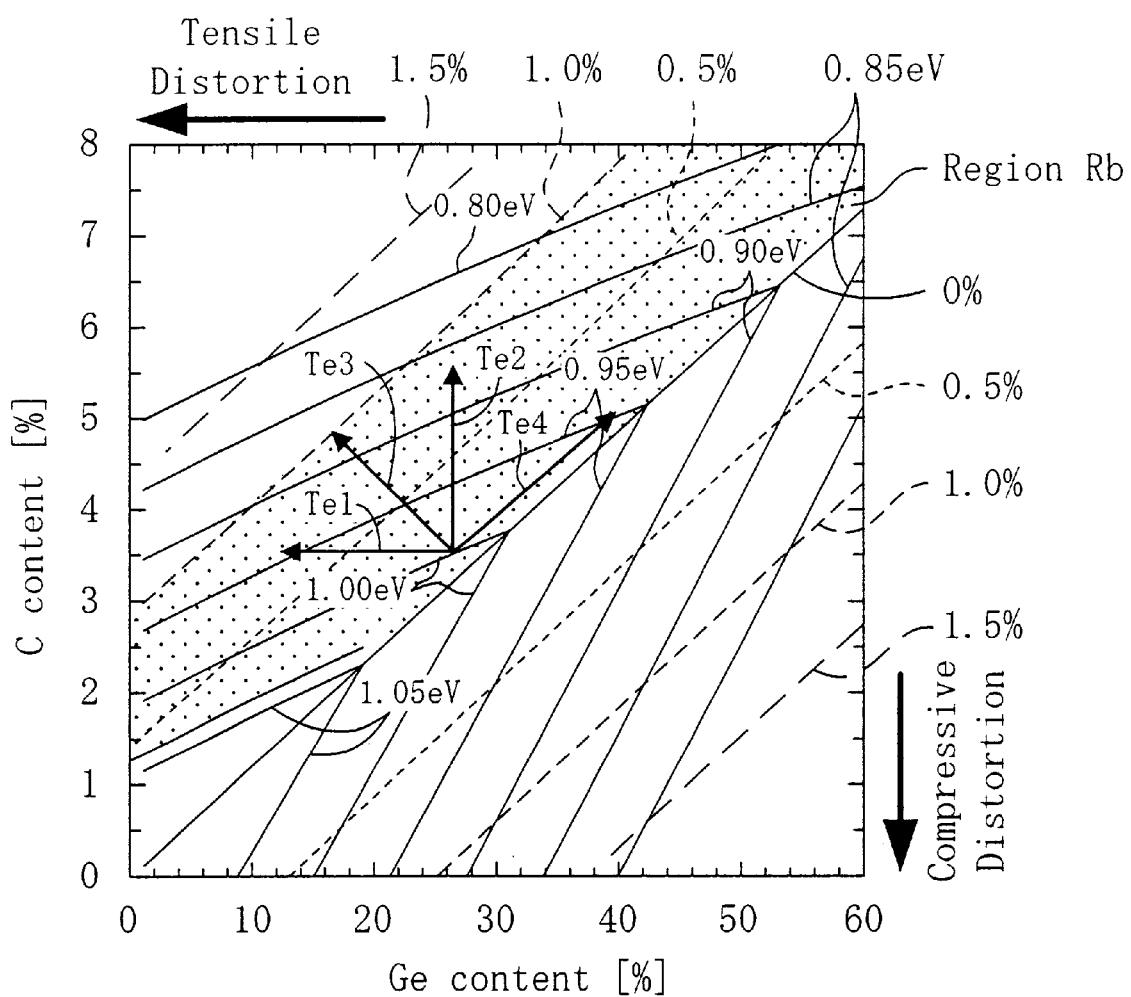
FIG. 16 is a diagram for explaining; a preferable composition gradating method for gradating the band gap in the region which has undergone a tensile strain shown in the state diagram of the SiGeC layer.

Composition Gradating Methods for the Region which has Undergone a Tensile Strain FIG. 16 is a diagram for explaining preferable composition gradating methods for gradating the band gap in the region which has undergone a tensile strain shown in the state diagram of the SiGeC layer 4. In order to reduce the band gap, approaches shown in straight lines Te1 to Te4 are available.

FIGS. 17(a) to 17(d) are diagrams showing composition gradating methods corresponding to straight lines Te1 to Te4, respectively shown in FIG. 16.

FIG. 17(a) is a diagram showing the case where in the SiGeC layer 4, the Ge content is linearly decreased in the direction from the Si layer 5 (emitter side) to the Si epitaxial layer 20 (collector side) while the C content is kept constant along the straight line Te1 shown in FIG. 16.

FIG. 17(b) is a diagram showing the case where in the SiGeC layer 4, the C content is linearly increased in the direction from the Si layer 5 (emitter side) to the Si epitaxial layer 20 (collector side) while the Ge content is kept constant along the straight line Te2 shown in FIG. 16.

FIG. 17(c) is a diagram showing the case where in the SiGeC layer 4, the Ge content is linearly decreased and the C content is linearly increased in the direction from the Si layer 5 (emitter side) to the Si epitaxial layer 20 (collector side) along the straight line Te3 shown in FIG. 16.

FIG. 17(d) is a diagram showing the case where in the SiGeC layer 4, both the Ge content and the C content are linearly increased in the direction from the Si layer 5 (emitter side) to the Si epitaxial layer 20 (collector side) along the straight line Te4 shown in FIG. 16.

As described above, when the composition of the portion in contact with the Si layer 5 (emitter side) of the SiGeC layer is made to agree with the lattice match requirements (on the straight line indicating a strain of 0%), inaccurate control of the SiGeC composition might cause a reverse band gap gradient (which makes the band gap decrease from the collector side to the emitter side), depending on the gradient direction of the SiGeC composition. For this reason, it is preferable that the composition of the SiGeC layer 4 is gradated in either one of the region Ra which undergoes a compressive strain or the region Rb which undergoes a tensile strain by bringing the composition of the portion of the SiGeC layer 4 which is in contact with the Si layer 5 out of the lattice match requirements.

In the present embodiment, of the SiGeC layer 4 composing the intrinsic base layer 8a in the SiGeC-HBT, the portion in contact with the Si layer 5 acting as the emitter layer 9 is not exclusively composed of Si, but further includes at least one of Ge and C so as to make the band gap of the portion of the SiGeC layer 4 that is in contact with the Si layer 5 smaller than the Si layer 5. As a result, in addition to the same effects as in the second embodiment, the built-in potential of the PN junction between the emitter and the base can be reduced, which leads to achievement of the SiGeC-HBT operative at a lower voltage.

The present embodiment also adopts a composition of SiGeC which makes the average amount of strain throughout the SiGeC layer 4 1.0%, so as to realize a heterojunction bipolar transistor which is operative at a low voltage and excels in high frequency characteristic.

In the present embodiment, of the SiGeC layer 4, the composition of the portion in contact with the Si layer 5 includes Si, Ge and C. However, as known from FIGS. 14 and 16, when the graded composition control is performed in the region Ra which has undergone a compressive strain, the portion may be composed of Si and Ge, without C, whereas when the graded composition control is performed in the region Rb which has undergone a tensile strain, the portion may be composed of Si and C, without Ge.

In the present embodiment, as shown in FIG. 13(b), the Ge content and the C content in the bottom layer 4b of the SiGeC layer 4 are gradually decreased in the direction from the center layer 4a to the Si epitaxial layer 20, and the Ge content and the content in the top layer 4c of the SiGeC layer4 are gradually increased in the direction from the Si layer 5 to the center layer 4a. Similar to the first embodiment, the occurrence of parasitic barriers (Refer to FIG. 6(a)) or notches (Refer to FIG. 7(a)) in the base-collector junction interface (the heterojunction barrier between the SiGeC layer 4 and the Si epitaxial layer 20) is prevented to suppress development of an explicit potential difference in the conduction bands, thereby obtaining a smooth band structure.

It must be noted that only the C content in the bottom layer 4b and the top layer 4c may be decreased gradually in the direction from the center layer 4a to either the Si epitaxial layer 20 or the Si layer 5, and that it is not always necessary to make the bottom layer 4b and the top layer 4c have a graded composition in some types of bipolar transistors where band offsets like notches cause no serious inconvenience.

In the SiGeC-HBT of the present embodiment including the intrinsic base layer 8a made of the SiGeC layer 4 with a graded composition, the provision of a graded composition where the C content and the Ge content gradually change at the Si/SiGeC heterojunction interface achieves a practical heterojunction bipolar transistor which excels in a high frequency characteristic, and not hinder the transit of the carriers.

Each of the aforementioned embodiments deals with improvement of the characteristics of the heterojunction bipolar transistor shown in FIG. 2 as a single structure; however, it goes without saying that a bipolar transistor of a BiCMOS device, which is an integration of a bipolar transistor and a CMOS, can be composed of the SiGeC-HBT of the present invention.

The present invention is described by taking a NPN-type SiGeC-HBT as an example in the embodiments; however, it goes without saying that the present invention is applicable to a PNP-type SiGeC-HBT.

What is claimed is:

1. A heterojunction bipolar transistor comprising a first semiconductor layer made from semiconductor material containing Si as a component; a second semiconductor layer made from semiconductor material containing Si, Ge and C as components having a band gap narrower than the first semiconductor layer and consisting of a top layer, a center layer and a bottom layer; a third semiconductor layer made from Si as a component, and having a band gap wider than the second semiconductor layer stacked in this order onto a substrate; and a heterojunction barrier provided between the first semiconductor layer and the second semiconductor layer, said heterojunction bipolar transistor further comprising:
a collector layer formed in the first semiconductor layer and containing a first conductive impurity;
a base layer formed in the second semiconductor layer and containing a second conductivity impurity; and
an emitter layer formed in the third semiconductor layer and containing a first conductivity impurity,
the second semiconductor layer having an average lattice strain of 1.0% or less; wherein
the first semiconductor layer is made of Si single crystal; and
when the second semiconductor layer has a composition represented by $Si_{1-x-y}Ge_xC_y$ where x is a Ge content and y is a C content, the composition is in a region surrounded by following four straight lines:
straight line ①: y=0.122x−0.032
straight line ②: y=0.1245x+0.028
straight line ③: y=0.2332x−0.0233 (C content is 22% or less)
straight line ④: y=0.0622x+0.0127 (Ge content is 22% or less)
on two-dimensional rectangular coordinates whose horizontal axis and vertical axis indicate the Ge content and the C content, respectively; wherein
the center layer of the second semiconductor layer has the Ge content and the C content uniformly;
wherein in the top layer of the second semiconductor layer, the C content increases in a direction from the third semiconductor layer to the center layer.

2. A heterojunction bipolar transistor comprising a first semiconductor layer made from semiconductor material containing Si as a component; a second semiconductor layer made from semiconductor material containing Si, Ge and C as components, having a band gap narrower than the first semiconductor layer and consisting of a top layer, a center layer and a bottom layer; a third semiconductor layer made from Si as a component, and having a band gap wider than the second semiconductor layer stacked in this order onto a substrate; and a heterojunction barrier provided between the first semiconductor layer and the second semiconductor layer, said heterojunction bipolar transistor further comprising:
a collector layer formed in the first semiconductor layer and containing a first conductive impurity;
a base layer formed in the second semiconductor layer and containing a second conductivity impurity; and
an emitter layer formed in the third semiconductor layer and containing a first conductivity impurity,
the second semiconductor layer having an average lattice strain of 1.0% or less; wherein
the first semiconductor layer is made of Si single crystal; and
when the second semiconductor layer has a composition represented by $Si_{1-x-y}Ge_xC_y$ where x is a Ge content and y is a C content, the composition is in a region surrounded by following four straight lines:
straight line ①: y=0.122x−0.032
straight line ②: y=0.1245x+0.028
straight line ③: y=0.2332x−0.0233 (C content is 22% or less)
straight line ④: y=0.0622x+0.0127 (Ge content is 22% or less)
on two-dimensional rectangular coordinates whose horizontal axis and vertical axis indicate the Ge content and the C content, respectively; wherein
the center layer of the second semiconductor layer has the Ge content and the C content uniformly;
wherein in the top layer of the second semiconductor layer, the C content and the Ge content increase in a direction from the third semiconductor layer to the center layer.

3. A heterojunction bipolar transistor comprising a first semiconductor layer made from semiconductor material containing Si as a component; a second semiconductor layer made from semiconductor material containing Si, Ge and C as components, having a band gap narrower than the first semiconductor layer and consisting of a top layer, a center layer and a bottom layer; a third semiconductor layer made from Si as a component, and having a band gap wider than the second semiconductor layer stacked in this order onto a substrate; and a heterojunction barrier provided between the first semiconductor layer and the second semiconductor layer, said heterojunction bipolar transistor further comprising:
a collector layer formed in the first semiconductor layer and containing a first conductive impurity;
a base layer formed in the second semiconductor layer and containing a second conductivity impurity; and
an emitter layer formed in the third semiconductor layer and containing a first conductivity impurity,
the second semiconductor layer having an average lattice strain of 1.0% or less; wherein
the first semiconductor layer is made of Si single crystal; and
when the second semiconductor layer has a composition represented by $Si_{1-x-y}Ge_xC_y$ where x is a Ge content and y is a C content, the composition is in a region surrounded by following four straight lines:
straight line ①: y=0.122x−0.032
straight line ②: y=0.1245x+0.028
straight line ③: y=0.2332x−0.0233 (C content is 22% or less)
straight line ①: y=0.0622x+0.0127 (Ge content is 22% or less)
on two-dimensional rectangular coordinates whose horizontal axis and vertical axis indicate the Ge content and the C content, respectively; wherein
the center layer of the second semiconductor layer has the Ge content and the C content uniformly;
wherein in the bottom layer of the second semiconductor layer, the C content decreases in a direction from the center layer to the first semiconductor layer.

4. A heterojunction bipolar transistor comprising a first semiconductor layer made from semiconductor material containing Si as a component; a second semiconductor layer made from semiconductor material containing Si, Ge and C as components, having a band gap narrower than the first semiconductor layer and consisting of a top layer, a center layer and a bottom layer; a third semiconductor layer made from Si as a component, and having a band gap wider than the second semiconductor layer stacked in this order onto a substrate; and a heterojunction barrier provided between the first semiconductor layer and the second semiconductor layer, said heterojunction bipolar transistor further comprising:
a collector layer formed in the first semiconductor layer and containing a first conductive impurity;
a base layer formed in the second semiconductor layer and containing a second conductivity impurity; and
an emitter layer formed in the third semiconductor layer and containing a first conductivity impurity,
the second semiconductor layer having an average lattice strain of 1.0% or less; wherein
the first semiconductor layer is made of Si single crystal; and
when the second semiconductor layer has a composition represented by $Si_{1-x-y}Ge_xC_y$ where x is a Ge content and y is a C content, the composition is in a region surrounded by following four straight lines:
straight line ①: y=0.122x−0.032
straight line ②: y=0.1245x+0.028
straight line ③: y=0.2332x−0.0233 (C content is 22% or less)
straight line ④: y=0.0622x+0.0127 (Ge content is 22% or less)
on two-dimensional rectangular coordinates whose horizontal axis and vertical axis indicate the Ge content and the C content, respectively; wherein
the center layer of the second semiconductor layer has the Ge content and the C content uniformly;
wherein in the bottom layer of the second semiconductor layer, the C content and the Ge content decrease in a direction from the center layer to the first semiconductor layer.

5. A heterojunction bipolar transistor comprising a first semiconductor layer made from semiconductor material containing Si as a component; a second semiconductor layer made from semiconductor material containing Si, Ge and C as components, having a band gap narrower than the first semiconductor layer and consisting of a top layer, a center layer and a bottom layer; a third semiconductor layer made from Si as a component, and having a band gap wider than the second semiconductor layer stacked in this order onto a substrate; and a heterojunction barrier provided between the first semiconductor layer and the second semiconductor layer, said heterojunction bipolar transistor further comprising:
a collector layer formed in the first semiconductor layer and containing a first conductive impurity;
a base layer formed in the second semiconductor layer and containing a second conductivity impurity; and
an emitter layer formed in the third semiconductor layer and containing a first conductivity impurity,
the second semiconductor layer having an average lattice strain of 1.0% or less;
wherein in the center layer of the second semiconductor layer, the band gap decreases in a direction from the third semiconductor layer to the first semiconductor layer.

6. The heterojunction bipolar transistor of claim 5, wherein
the third semiconductor layer is exclusively made from Si;
the top layer of the second semiconductor layer has a composition which changes continuously to the center layer, and a portion of the top layer that is in contact with the third semiconductor layer is exclusively made from Si; and
the center layer and top layer of the second semiconductor layer have a composition where at least one of the Ge content and the C content increases in a direction from the third semiconductor layer to the first semiconductor layer.

7. The heterojunction bipolar transistor of claim 6, wherein in the center layer and top layer of the second semiconductor layer, the Ge content and the C content increase while a ratio between the Ge content and the C content is kept constant.

8. The heterojunction bipolar transistor of claim 5, wherein in the bottom layer of the second semiconductor layer, the C content decreases in a direction from the center layer to the first semiconductor layer.

9. The heterojunction bipolar transistor of claim 5, wherein in the bottom layer of the second semiconductor layer, the Ge content and the C content decrease in a direction from the center layer to the first semiconductor layer.

10. The heterojunction bipolar transistor of claim 5, wherein
the top layer of the second semiconductor layer is made from Si and contains at least one of Ge and C, and
the second semiconductor layer has a graded composition where either the Ge content or the C content changes in a direction from the third semiconductor layer to the first semiconductor layer.

11. The heterojunction bipolar transistor of claim 10, wherein
the center layer of the second semiconductor layer has a composition which undergoes a compressive strain, and also has a graded composition where the Ge content increases in a direction from the third semiconductor layer to the first semiconductor layer, while the C content is kept constant.

12. The heterojunction bipolar transistor of claim 10, wherein
the center layer of the second semiconductor layer has a composition which undergoes a compressive strain, and also has a graded composition where the C content decreases in a direction from the third semiconductor layer to the first semiconductor layer, while the Ge content is kept constant.

13. The heterojunction bipolar transistor of claim 10, wherein
the center layer of the second semiconductor layer has a composition which undergoes a compressive strain, and also has a graded composition where the Ge content increases and the C content decreases in a direction from the third semiconductor layer to the first semiconductor layer.

14. The heterojunction bipolar transistor of claim 10, wherein
the center layer of the second semiconductor layer has a composition which undergoes a compressive strain, and also has a graded composition where the Ge content and the C content increase in a direction from the third semiconductor layer to the first semiconductor layer.

15. The heterojunction bipolar transistor of claim 10, wherein
the center layer of the second semiconductor layer has a composition which undergoes a tensile strain, and also has a graded composition where the Ge content decreases in a direction from the third semiconductor layer to the first semiconductor layer, while the C content is kept constant.

16. The heterojunction bipolar transistor of claim 10, wherein the center layer of the second semiconductor layer has a composition which undergoes a tensile strain, and also has a graded composition where the C content increases in a direction from the third semiconductor layer to the first semiconductor layer, while the Ge content is kept constant.

17. The heterojunction bipolar transistor of claim 10, wherein the center layer of the second semiconductor layer has a composition which undergoes a tensile strain, and also has a graded composition where the Ge content decreases and the C content increases in a direction from the third semiconductor layer to the first semiconductor layer.

18. The heterojunction bipolar transistor of claim 10, wherein the center layer of the second semiconductor layer has a composition which undergoes a tensile strain, and also has a graded composition where the Ge content and the C content increase in a direction from the third semiconductor layer to the first semiconductor layer.

19. The heterojunction bipolar transistor of claim 10, wherein in an end region of the second semiconductor layer that is between the center layer and the third semiconductor layer in a vertical direction, the C content increases in a direction from the third semiconductor layer to the center layer.

20. The heterojunction bipolar transistor of claim 10, wherein in the top layer of the second semiconductor layer, the C content and the Ge content increase in a direction from the third semiconductor layer to the center layer.

21. The heterojunction bipolar transistor of claim 10, wherein in the bottom layer of the second semiconductor layer, the C content decreases in a direction from the center layer to the first semiconductor layer.

22. The heterojunction bipolar transistor of claim 10, wherein in the bottom layer of the second semiconductor layer, the C content and the Ge content decrease in a direction from the center layer to the first semiconductor layer.

* * * * *

UNITED STATES PATENT AND TRADEMARK OFFICE
CERTIFICATE OF CORRECTION

PATENT NO.   : 6,492,711 B1
DATED        : December 10, 2002
INVENTOR(S)  : Takeshi Takagi et al.

Page 1 of 1

It is certified that error appears in the above-identified patent and that said Letters Patent is hereby corrected as shown below:

Column 24,
Line 63, insert -- , -- after "components";

Column 26,
Line 46, replace "1" with -- 4 --;

Signed and Sealed this

Twenty-seventh Day of April, 2004

JON W. DUDAS
*Acting Director of the United States Patent and Trademark Office*